United States Patent
Hong et al.

(10) Patent No.: US 9,711,505 B2
(45) Date of Patent: Jul. 18, 2017

(54) SEMICONDUCTOR DEVICES HAVING DUMMY GATE STRUCTURE FOR CONTROLLING CHANNEL STRESS

(71) Applicant: SAMSUNG ELECTRONICS CO., LTD., Suwon-si, Gyeonggi-do (KR)

(72) Inventors: Byoung-Hak Hong, Seoul (KR); Bon-Woong Koo, Seoul (KR); Sung-Il Park, Suwon-si (KR); Kyu-Baik Chang, Seoul (KR); Keun-Hwi Cho, Seoul (KR); Dae-Won Ha, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/094,282

(22) Filed: Apr. 8, 2016

(65) Prior Publication Data

US 2017/0033217 A1    Feb. 2, 2017

(30) Foreign Application Priority Data

Jul. 28, 2015 (KR) .................. 10-2015-0106788

(51) Int. Cl.
| | | |
|---|---|---|
| H01L 23/52 | (2006.01) | |
| H01L 27/092 | (2006.01) | |
| H01L 29/78 | (2006.01) | |
| H01L 29/49 | (2006.01) | |
| H01L 29/423 | (2006.01) | |
| H01L 29/66 | (2006.01) | |

(52) U.S. Cl.
CPC ...... *H01L 27/0924* (2013.01); *H01L 29/4238* (2013.01); *H01L 29/4966* (2013.01); *H01L 29/66545* (2013.01); *H01L 29/785* (2013.01); *H01L 29/7845* (2013.01); *H01L 29/7848* (2013.01)

(58) Field of Classification Search
CPC ............ H01L 29/7842; H01L 27/0924; H01L 29/4238; H01L 29/4966; H01L 29/7848; H01L 29/785
See application file for complete search history.

(56) References Cited

U.S. PATENT DOCUMENTS

| | | | |
|---|---|---|---|
| 9,209,182 B2* | 12/2015 | Chern | ................. H01L 27/0207 |
| 9,330,978 B2* | 5/2016 | Taniguchi | ....... H01L 21/823437 |
| 2008/0246092 A1 | 10/2008 | Lee et al. | |
| 2010/0102394 A1 | 4/2010 | Yamakawa et al. | |
| 2011/0003450 A1 | 1/2011 | Lee et al. | |

(Continued)

FOREIGN PATENT DOCUMENTS

JP   2013-135157   7/2013

*Primary Examiner* — Nicholas Tobergte

(74) *Attorney, Agent, or Firm* — F. Chau & Associates, LLC

(57) ABSTRACT

A semiconductor device includes a gate structure on a substrate. The gate structure includes a first gate insulation pattern, a conductive pattern for controlling a threshold voltage, a first gate electrode and a first mask sequentially stacked. A dummy gate structure is spaced apart from the gate electrode. The dummy gate structure includes a first stressor pattern including titanium oxide. Source/drain regions are adjacent to the gate structure. The source/drain regions are doped with p-type impurities. The first stressor pattern may apply a stress onto the channel region of a transistor, and consequently the transistor having good electrical characteristics may be obtained.

20 Claims, 17 Drawing Sheets

(56) References Cited

U.S. PATENT DOCUMENTS

| | | |
|---|---|---|
| 2011/0248339 A1* | 10/2011 | Kim ................ H01L 21/823437 |
| | | 257/331 |
| 2013/0075821 A1* | 3/2013 | Baars ................ H01L 29/66545 |
| | | 257/368 |
| 2013/0277760 A1 | 10/2013 | Lu et al. |
| 2014/0213048 A1 | 7/2014 | Sun et al. |
| 2014/0312393 A1 | 10/2014 | Rodder et al. |
| 2015/0008489 A1 | 1/2015 | Ching et al. |
| 2015/0091060 A1 | 4/2015 | Yang et al. |
| 2015/0091188 A1 | 4/2015 | Lee et al. |

* cited by examiner

SEMICONDUCTOR DEVICES HAVING DUMMY GATE STRUCTURE FOR CONTROLLING CHANNEL STRESS

CROSS-REFERENCE TO RELATED APPLICATION

This application claims priority under 35 USC §119 to Korean Patent Application No. 10-2015-0106788, filed on Jul. 28, 2015 in the Korean Intellectual Property Office (KIPO), the contents of which are incorporated by reference herein in their entirety.

TECHNICAL FIELD

The present invention relates generally to semiconductor devices and methods of manufacturing the same, more particularly, relates to semiconductor devices including transistors and methods of manufacturing the same.

DISCUSSION OF RELATED ART

It is known in the field of semiconductor device design that mechanical stresses in the device substrate can affect the device performance. Thus, engineering stress within the device substrate enhances the performance of the semiconductor device. For example, applying stress to the channel region of a field-effect transistor (FET) will result in increasing mobility of electrons or holes, which in turn increases device speed and performance.

SUMMARY

Example embodiments of the present invention provide a semiconductor device including a transistor having good characteristics.

Example embodiments of the present invention provide a method of manufacturing the semiconductor device including the transistor having good characteristics.

According to an example embodiment of the present invention, there is provided a semiconductor device. The semiconductor device includes a gate structure, a dummy gate structure and source/drain regions. The gate structure is formed on a substrate. The gate structure includes a first gate insulation pattern, a conductive pattern for controlling a threshold voltage, a first gate electrode and a first mask sequentially stacked. The dummy gate structure spaced apart from the gate structure. The dummy gate structure includes a first stressor pattern including titanium oxide. The source/drain regions are adjacent to the gate structure. The source/drain regions are doped with p-type impurities.

In an example embodiment of the present invention, the dummy gate structure may have a stacked structure different from a stacked structure of the gate structure.

In an example embodiment of the present invention, the dummy gate structure may include a second gate insulation pattern, the first stressor pattern, a second gate electrode and a second mask sequentially stacked.

In an example embodiment of the present invention, the conductive pattern of the gate structure may include titanium.

In an example embodiment of the present invention, the first stressor pattern of the dummy gate structure may include an oxide of a material included in the conductive pattern.

In an example embodiment of the present invention, a barrier pattern including titanium may be further formed on the conductive pattern of the gate structure.

In an example embodiment of the present invention, a second stressor pattern may be further formed on the first stressor pattern of the dummy gate structure. The second stressor pattern may include an oxide of a material included in the barrier pattern.

In an example embodiment of the present invention, a width of the dummy gate structure may be substantially equal to or greater than a width of the gate structure.

In an example embodiment of the present invention, a plurality of dummy gate structures may be adjacent to each of opposite sidewalls of the gate structure.

In an example embodiment of the present invention, an active fin may be formed to protrude from a surface of the substrate. Each of the gate structure and the dummy gate structure may be formed on sidewalls and a top surface of the active fin, and extends in a direction crossing the active fin.

In an example embodiment of the present invention, an additional dummy gate structure may be further formed between the gate structure and the dummy gate structure. The additional dummy gate structure may have a stacked structure substantially the same as a stacked structure of the gate structure.

According to an example embodiment of the present invention, there is provided a semiconductor device. The semiconductor device includes a first transistor and a second transistor. The first transistor includes a first gate structure, a first dummy gate structure and first source/drain regions, and the second transistor includes a second gate structure, a second dummy gate structure and second source/drain regions. The first gate structure is formed on a substrate. The first gate structure includes a first gate insulation pattern, a first conductive pattern for controlling a threshold voltage, a first gate electrode and a first mask sequentially stacked. The first dummy gate structure is spaced apart from the first gate structure. The first dummy gate structure includes a first stressor pattern including titanium oxide. The first source/drain regions are adjacent to the first gate structure. The first source/drain regions are doped with p-type impurities. The second gate structure is formed on the substrate. The second gate structure includes a second gate insulation pattern, a second conductive pattern for controlling a threshold voltage, a second gate electrode and a second mask sequentially stacked. The second dummy gate structure is spaced apart from the second gate structure. The second dummy gate structure does not include titanium and titanium oxide. The second source/drain regions are adjacent to the second gate structure. The second source/drain regions are doped with n-type impurities.

In an example embodiment of the present invention, the second dummy gate structure may include the second gate insulation pattern, the second gate electrode and the second mask sequentially stacked.

In an example embodiment of the present invention, the first conductive pattern may have a work function more than about 4.5 eV, and the second conductive pattern may have a work function less than about 4.5 eV.

In an example embodiment of the present invention, the first and the second conductive patterns may include titanium.

In an example embodiment of the present invention, a second stressor pattern may be formed on the first stressor pattern of the first dummy gate structure.

In an example embodiment of the present invention, a width of the first dummy gate structure is substantially equal to or greater than a width of the first gate structure.

In an example embodiment of the present invention, a first active fin may be formed to protrude from a surface of the substrate, in which each of the first gate structure and the first dummy gate structure is formed on sidewalls and a top surface of the first active fin, and extends in a direction crossing the first active fin.

In an example embodiment of the present invention, a second active fin may be formed to protrude from a surface of the substrate, in which each of the second gate structure and the second dummy gate structure is formed on sidewalls and a top surface of the second active fin, and extends in a direction crossing the second active fin.

In an example embodiment of the present invention, an additional first dummy gate structure may be formed between the first gate structure and the first dummy gate structure, in which the additional first dummy gate structure has a stacked structure substantially the same as a stacked structure of the first gate structure.

According to an example embodiment of the present invention, there is provided a semiconductor device. The semiconductor device includes a gate structure, a dummy gate structure and source/drain regions. The gate structure is formed on a substrate. The gate structure includes a first gate insulation pattern, a conductive pattern for controlling a threshold voltage, a first gate electrode and a first mask sequentially stacked. The dummy gate structure spaced apart from the gate structure. The dummy gate structure does not include titanium and titanium oxide. The source/drain regions are adjacent to the gate structure. The source/drain regions are doped with n-type impurities.

According to an example embodiment of the present invention, there is provided a method of manufacturing a semiconductor device. In the method, a preliminary gate structure and a preliminary dummy structure are formed on a substrate. Each of the preliminary gate structure and the preliminary dummy structure include a gate insulation layer and a conductive pattern for controlling a threshold voltage including titanium substantially stacked. The conductive pattern of the preliminary dummy structure is selectively oxidized to form a first stressor pattern. A gate electrode and a mask are formed on each of the preliminary gate structure and the first stressor pattern, so that a gate structure and a dummy gate structure are formed. Source/drain regions of p-type are formed adjacent to the gate structure.

In an example embodiment of the present invention, the conductive pattern may include titanium.

In an example embodiment of the present invention, an oxidation process for forming the first stressor pattern may include a plasma oxidation process.

In an example embodiment of the present invention, before the oxidation process for forming the first stressor pattern, a mask pattern may be formed to cover the conductive pattern of the gate structure.

In an example embodiment of the present invention, before forming the preliminary gate structure and the preliminary dummy gate structure, the substrate partially may be etched to form an active fin protruding from the substrate.

According to an example embodiment of the present invention, the semiconductor device may include the transistor having good electrical characteristics. Also, the semiconductor device may have a high reliability.

BRIEF DESCRIPTION OF THE DRAWINGS

Example embodiments of the present invention will be more clearly understood from the following detailed description taken in conjunction with the accompanying drawings, and in which.

Figure 1:
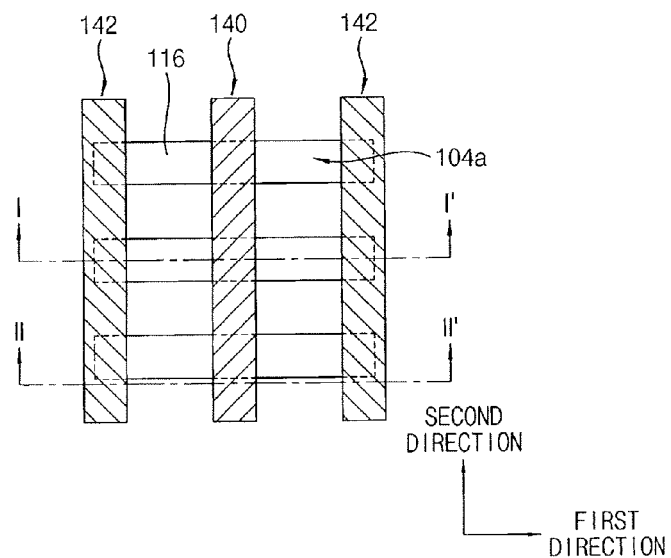
FIGS. 1 to 4 are a plan view, cross-sectional views and a perspective view illustrating a semiconductor device in accordance with an example embodiment of the present invention.

Since the drawings in FIGS. 1-28 are intended for illustrative purpose, the elements in the drawings are not necessarily drawn to scale. For example, some of the elements may be enlarged or exaggerated for clarity purpose.

DETAILED DESCRIPTION OF THE EMBODIMENTS

Various example embodiments of the present invention will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art.

It will be understood that when an element or layer is referred to as being "on", "connected to" or "coupled to" another element or layer, it can be directly on, connected or coupled to the other element or layer, or intervening elements or layers may be present. In contrast, when an element or layer is referred to as being "directly on", "directly connected to" or "directly coupled to" another element or layer, there are no intervening elements or layers present. Like numerals refer to like elements throughout the specification. As used herein, the term "and/or" includes any and all combinations of one or more of the associated listed items.

It will be understood that, although the terms "first", "second", "third", "fourth" etc. may be used herein to describe various elements, components, regions, layers and/ or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, or vice versa, without departing from the teachings of the present inventive concept.

Spatially relative terms, such as "beneath", "below", "lower", "above", "upper" and the like, may be used herein to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be oriented differently (for example, rotated 90 degrees or at other orientations) and the spatially relative descriptors used herein would then be interpreted accordingly.

The terminology used herein is for the purpose of describing particular example embodiments and is not intended to be limiting of the present inventive concept. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, components, and/or groups, but do not preclude the presence or addition of one or more other features, integers, steps, operations, elements, components, and/or groups thereof.

Example embodiments of the present invention are described herein with reference to the cross-sectional illustrations that are schematic illustrations of idealized example embodiments. As such, variations from the shapes of the illustrations caused from, for example, various manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features, and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shapes of the regions of a device, and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
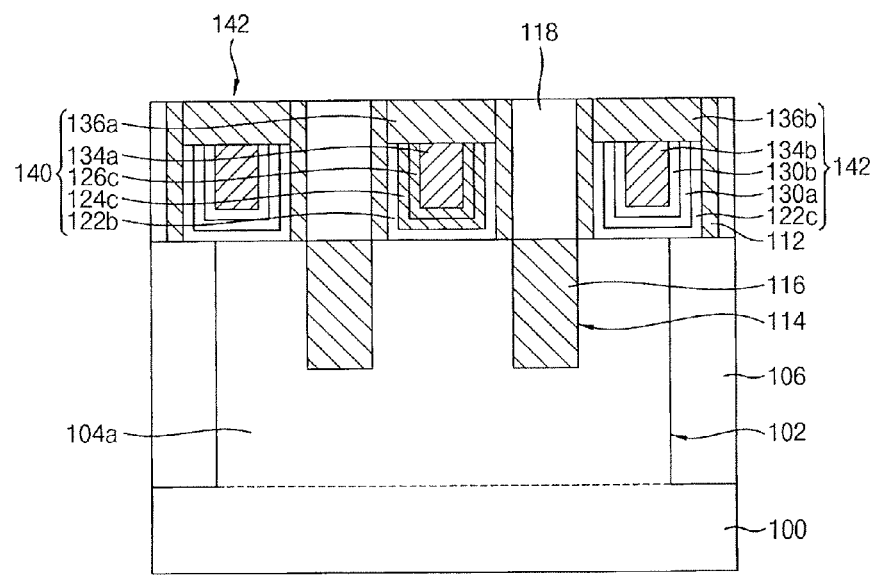
Figure 3:
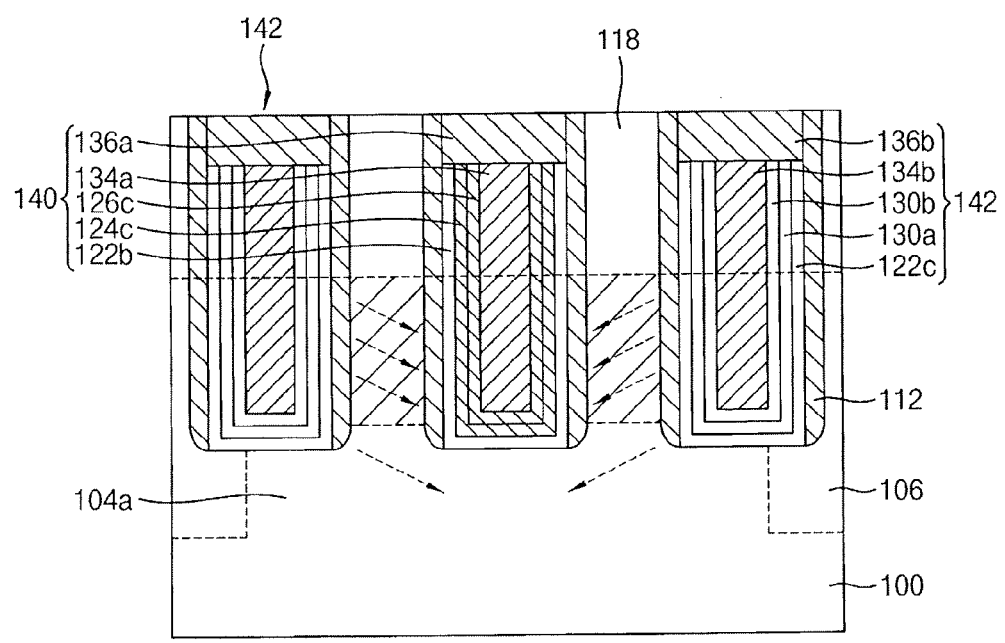
Figure 4:
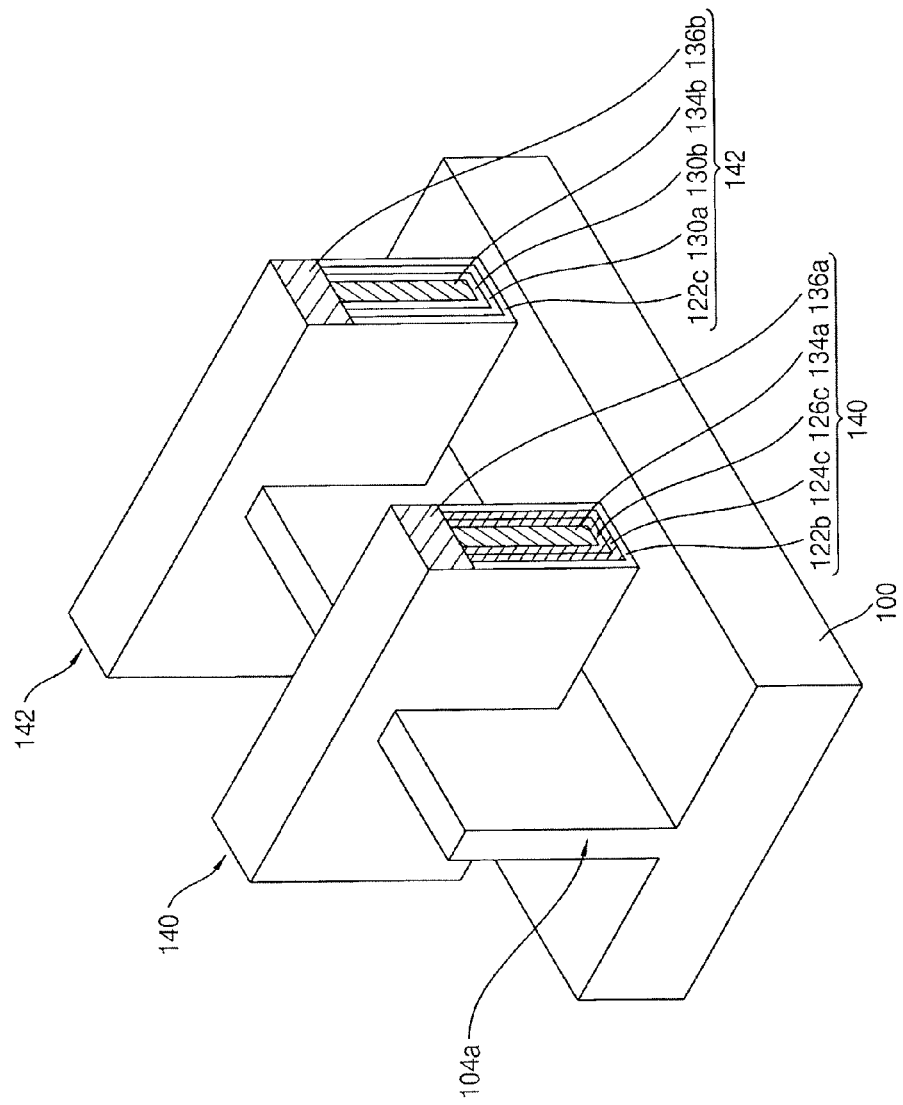

FIGS. 1 to 4 are a plan view, cross-sectional views and a perspective view illustrating a semiconductor device in accordance with an example embodiment of the present invention. Particularly, FIG. 1 is the plan view, FIGS. 2 and 3 are the cross-sectional views, and FIG. 4 is the perspective view.

FIGS. 2 and 3 are the cross-sectional views taken along lines I-I' and II-II' respectively, of FIG. 1, and FIG. 4 is the perspective view of a gate structure and a dummy gate structure in the semiconductor device. In an example embodiment of the present invention, the semiconductor device may include a p-type FinFET.

Referring to FIGS. 1 to 4, a gate structure 140 and a dummy gate structure 142 neighboring the gate structure 140 in a first direction may be formed on a substrate 100. A stacked structure of the gate structure 140 may be different from a stacked structure of the dummy gate structure 142. Spacers 112 may be formed on sidewalls of each of the gate structure 140 and the dummy gate structure 142.

The substrate 100 may include a semiconductor material, e.g., silicon, germanium, silicon-germanium, etc., or III-V semiconductor compounds, e.g., GaP, GaAs, GaSb, etc. In some example embodiments of the present invention, the substrate 100 may be a silicon-on-insulator (SOI) substrate, or a germanium-on-insulator (GOI) substrate.

A plurality of active fins 104a may protrude upwardly from a surface of the substrate 100. An isolation layer 106 may be formed between the active fins 104a. The isolation layer 106 may include an oxide, e.g., silicon oxide.

In an example embodiment of the present invention, each of the active fins 104a may extend in the first direction. A plurality of recesses 114 may be formed at upper portions of the active fins 104a. Thus, the active fin 104a between the recesses 114 may protrude from a bottom of the recesses 114. An active region may be defined as a portion of the active fin 104a having a top surface not covered by the isolation layer 106.

The gate structure 140 may extend in a second direction substantially perpendicular to the first direction, and may be formed on sidewalls and a top surface of the active fin 104a. The gate structure 140 may serve as a gate of the p-type FinFET.

In an example embodiment of the present invention, the gate structure 140 may be formed on the active fin 104a and the isolation layer 106, and may include a first gate insulation pattern 122b, a threshold voltage control pattern 124c, a barrier pattern 126c, a first gate electrode 134a and a first hard mask 136a sequentially stacked. In an example embodiment of the present invention, the first gate insulation pattern 122b may include a metal oxide, e.g., hafnium oxide ($HfO_2$), tantalum oxide ($Ta_2O_5$), zirconium oxide ($Zr_2O_2$), etc.

The threshold voltage control pattern 124c may adjust a threshold voltage of the p-type FinFET. The threshold voltage control pattern 124c may include a metal or a metal alloy having a work function higher than about 4.5 eV. For example, the threshold voltage control pattern 124c may include titanium, titanium nitride, titanium aluminum nitride, etc. In an example embodiment of the present invention, the threshold voltage control pattern 124c may include titanium. The work function of the threshold voltage control pattern 124c may be controlled by a combination of the metals included in the threshold voltage control pattern 124c. For example, the barrier pattern 126c may include titanium, titanium nitride, etc. In an example embodiment of the present invention, the barrier pattern 126c may include titanium.

In some example embodiments of the present invention, the threshold voltage control pattern 124c may serve as a barrier pattern, so that the barrier pattern 126c may not be formed. In some example embodiments of the present invention, the barrier pattern 126c may include, e.g., tantalum, tantalum nitride, etc.

The first gate electrode 134a may include a metal, e.g., aluminum (Al), copper (Cu), tantalum (Ta), etc., or a metal nitride thereof.

The threshold voltage control pattern 124c, the barrier pattern 126c, and the first gate electrode 134a may be sequentially stacked to form a stacked structure. The first gate insulation pattern 122b may surround sidewalls and a bottom of the stacked structure.

The first hard mask 136a may be formed on the first gate electrode 134a, and may include a nitride, e.g., silicon nitride.

In an example embodiment of the present invention, an interface layer may be further formed between the active fin 104a and the gate structure 140. The interface layer may include, e.g., silicon oxide.

The spacers 112 may be formed on sidewalls of the gate structure 140 and sidewalls of the dummy gate structure 142.

The dummy gate structure 142 may be spaced apart from the gate structure 140 in the first direction, and may be disposed adjacent to the gate structure 140. The dummy gate structure 142 may be formed on the sidewalls and the top surface of the active fin 104a, and may extend in the second direction.

The dummy gate structure 142 may not serve as a gate of the p-type FinFET. The dummy gate structure 142 may serve as a stressor to apply stress to a channel region of the p-type FinFET. Also, when the gate structure 140 is formed by a photolithography process and/or a polishing process, the dummy gate structure 142 may prevent not-etching, over-etching, dishing, etc.

In an example embodiment of the present invention, a plurality of dummy gate structures 142 may be adjacent to opposite sidewalls of the gate structure 140. As shown in FIG. 2, a bottom portion of one side of the dummy gate structure 142 farthest from the sidewalls of the gate structure 140 may overlap with a top surface of the isolation layer 106.

In an example embodiment of the present invention, the dummy gate structure 142 may include a second gate insulation pattern 122c, a first stressor pattern 130a, a second stressor pattern 130b, a second gate electrode 134b and a second hard mask 136b sequentially stacked. The second gate insulation pattern 122c may include a material substantially the same as the material of the first gate insulation pattern 122b, and the second gate electrode 134b may include a material substantially the same as the material of the first gate electrode 134a. The second hard mask 136b may include a material substantially the same as the material of the first hard mask 136a, respectively. In some example embodiments of the present invention, the second gate insulation pattern 122c may include a material substantially the same as the material of the first gate insulation pattern 122b, and the second hard mask 136b may include a material substantially the same as the material of the first hard mask 136a. The second gate electrode 134b may include a material different from the material of the first gate electrode 134a. For example, the second gate electrode 134b may include an oxide of the metal in the first gate electrode 134a.

The first stressor pattern 130a may include an oxide of the material included in the threshold voltage control pattern 124c. The second stressor pattern 130b may include an oxide of the material included in the barrier pattern 126c. Each of the threshold voltage control pattern 124c and the barrier pattern 126c may include titanium, so that the first and second stressor patterns 130a and 130b may include titanium oxide.

In an example embodiment of the present invention, when the barrier pattern 126c is not formed, the second stressor 130b may not be formed either.

Titanium oxide may apply a compressive stress onto the substrate 100. That is, the first and second stressor patterns 130a and 130b may apply a compressive stress onto a channel region under the gate structure 140.

As a semiconductor device is highly integrated, the distance between the gate structure 140 and the dummy gate structure 142 may become smaller. Thus, titanium oxide in the dummy gate structure 142 may sufficiently apply the compressive stress onto the channel region of the p-type FinFET. Particularly, the dummy gate structure 142 may surround the sidewalls and the top surfaces of the active fin 104a, so that a contact area between the dummy gate structure 142 and the active fin 104a may become larger. Thus, the dummy gate structure 142 may apply more compressive stress onto the channel region of the p-type FinFET. With hole mobility of the p-type FinFET increased, so that the p-type FinFET has enhanced electrical characteristics.

In an example embodiment of the present invention, the width in the first direction of the gate structure 140 may be substantially equal to the width in the first direction of the dummy gate structure 142.

The recess 114 may be disposed at an upper portion of the active fin 104a between the spacers 112. An epitaxial pattern 116 may be formed in the recess 114. The epitaxial pattern 116 may protrude from the portion of the active fin 104a in the recess 114 in the second direction. In an example embodiment of the present invention, the epitaxial pattern 116 may have a cross-section taken along the second direction, of which a shape may be pentagon, hexagon, or rhombus.

In an example embodiment of the present invention, a plurality of epitaxial patterns 116 disposed in the second direction may be connected to each other to be merged into a single layer pattern.

In an example embodiment of the present invention, the epitaxial pattern 116 may be doped with p-type impurities, e.g., boron, aluminum, etc., so that the epitaxial pattern 116 may serve as source/drain regions of the p-type FinFET.

In an example embodiment of the present invention, the epitaxial pattern 116 may include silicon-germanium. Germanium included in epitaxial pattern 116 may apply stress onto the channel region of the p-type FinFET. However, if a germanium concentration of the epitaxial pattern 116 is excessively increased, defects, e.g., a lattice mismatch may occur. Thus, limited germanium concentration (not excessive) may be included in the epitaxial pattern 116 to apply stress onto the channel region of the p-type FinFET.

In an example embodiment of the present invention, the recess 114 may not be formed at the active fin 104a, and thus the epitaxial pattern 116 may not be formed in the recess 114. In this case, the p-type impurities may be doped into the active fin 104a, and source/drain regions may be formed at the active fin 104a.

In an example embodiment of the present invention, a metal silicide pattern may be further formed at an upper portion of the epitaxial pattern 116.

A first insulating interlayer 118 may fill a space between the gate structure 140 and the dummy gate structure 142.

A second insulating interlayer may be further formed on the first insulating interlayer 118, the gate structure 140 and the dummy gate structure 142. A wiring structure may be formed through the first insulating interlayer 118 and the second insulating interlayer, and may be electrically connected with the source/drain regions in the epitaxial pattern 116. The wiring structure may include a contact plug and a wiring pattern on the contact plug. The contact plug may be self-aligned with the spacer 112, so that a sidewall of the contact plug may contact the spacer 112.

In an example embodiment of the present invention, the semiconductor device may include the p-type FinFET. However, in some example embodiments of the present invention, the semiconductor device may include various other types of transistors which include a gate structure and a dummy gate structure. For example, the transistors may include a p-type planar transistor, a p-type recessed channel transistor, etc. Also, the transistors may include p-type transistors formed on a nanowire or a nanobelt.

As described above, the dummy gate structure 142 may include the first and second stressor patterns 130a and 130b which include titanium oxide. Thus, compressive stress may be sufficiently applied to the channel region of the p-type FinFET by the first and second stressor patterns 130a and 130b which include titanium oxide, and consequently the p-type FinFET having good electrical characteristics may be obtained.

FIGS. 5 to 11 are cross-sectional views illustrating stages of a method of manufacturing a semiconductor device in accordance with an example embodiment of the present invention.

FIGS. 5 to 11 are cross-sectional views taken along a line I-I' of FIG. 1.

Figure 5:
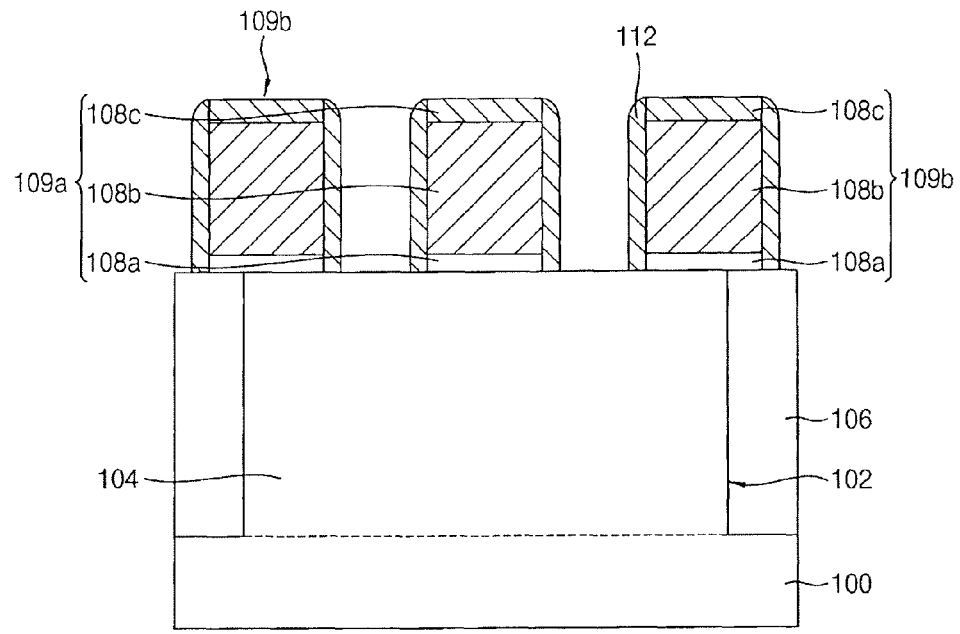
FIGS. 5 to 11 are cross-sectional views illustrating stages of a method of manufacturing the semiconductor device in accordance with an example embodiment of the present invention.

Referring to FIG. 5, an isolation layer 106 and a preliminary active fin 104 may be formed on a substrate 100 by, e.g., a shallow trench isolation (STI) process. A first mold structure 109a and a second mold structure 109b may be formed on the substrate 100. Also, spacers 112 may be formed on sidewalls of the first and second mold structures 109a and 109b, respectively.

The substrate 100 may include a semiconductor material, e.g., silicon, germanium, silicon-germanium, etc., or a III-V group semiconductor compound, e.g., GaP, GaAs, GaSb, etc. In some example embodiments of the present invention, the substrate 100 may be a silicon-on-insulator (SOI) substrate, a germanium-on-insulator (GOI) substrate, etc.

The isolation layer 106 may be formed by: etching an upper portion of the substrate 100 to form a trench 102 and a preliminary active fin 104, forming an insulation layer on the substrate 100 to fill the trench 102, and planarizing the insulation layer until the top surface of the substrate 100 may be exposed. Additionally, an upper portion of the insulation layer may be partially etched to expose upper sidewalls of the preliminary active fin 104.

Figure 11:
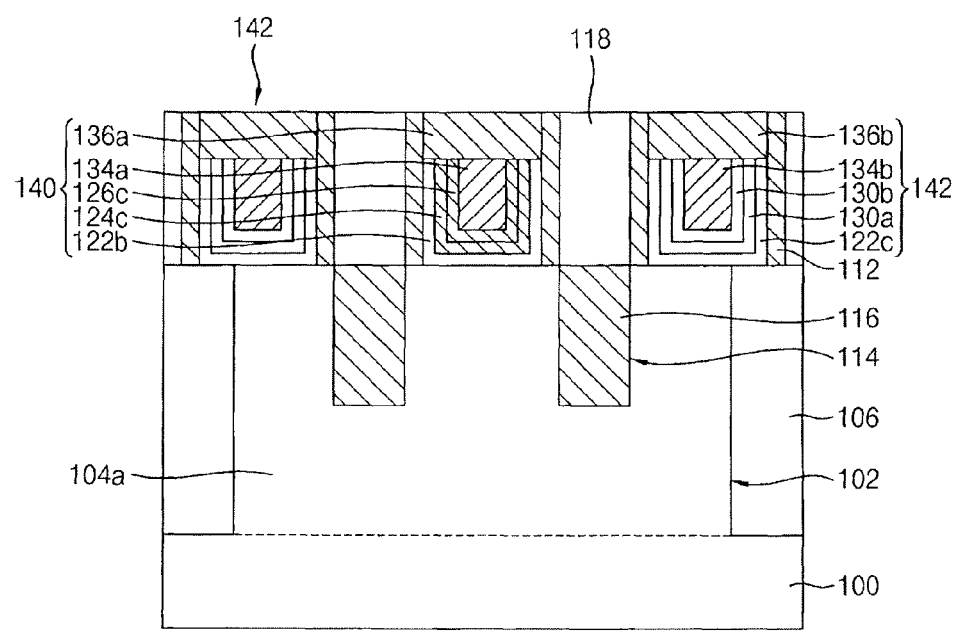

The first mold structure 109a may provide a structure for forming a gate structure 140 (refer to FIG. 11), and the second mold structure 109b may provide a structure for forming a dummy gate structure 142 (refer to FIG. 11).

The first and second mold structures 109a and 109b may be formed by: sequentially forming a mold gate insulation layer, a mold gate electrode layer and a hard mask layer on the substrate 100, patterning the hard mask layer by a photolithography process using a photoresist pattern as an etching mask to form a hard mask 108c, and sequentially etching the mold gate electrode layer and the mold gate insulation layer using the hard mask 108c as an etching mask. Thus, the first and second mold structures 109a and 109b may be formed on the substrate 100, and each of the first and second mold structures 109a and 109b may include a mold gate insulation pattern 108a, a mold gate electrode 108b and the hard mask 108c sequentially stacked.

The mold gate insulation pattern 108a may be formed of an oxide, e.g., silicon oxide, the mold gate electrode 108b may be formed of, e.g., polysilicon, and the hard mask 108c may be formed of a nitride, e.g., silicon nitride. The mold gate insulation layer may be formed by a chemical vapor deposition (CVD) process, an atomic layer deposition (ALD) process, etc. Alternatively, the mold gate insulation layer may be formed by a thermal oxidation process. The mold gate electrode layer and the hard mask layer may be formed by a CVD process, an ALD process, etc.

A spacer layer may be conformally formed on the first and second mold structures 109a and 109b, the isolation layer 106 and the substrate 100. The spacer layer may be formed of, e.g., silicon nitride. The spacer layer may be formed by a CVD process or an ALD process. The spacer layer may be isotropically etched to form the spacers 112 on sidewalls of each of the first and the second mold structures 109a and 109b.

Figure 6:
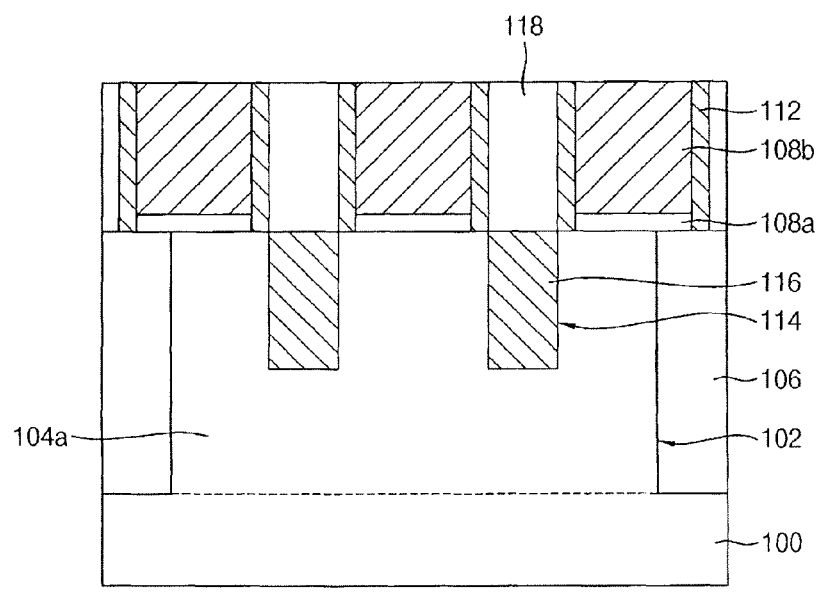

Referring to FIG. 6, a recess 114 may be formed at an upper portion of the preliminary active fin 104 between the spacers 112, and an epitaxial pattern 116 including source/drain regions may be formed to fill the recess 114. A first insulating interlayer 118 may be formed to fill a space between the first and second mold structures 109a and 109b.

Particularly, the preliminary active fin 104 may be anisotropically etched using the first and second mold structures 109a and 109b and the spacers 112 as an etch mask to form an active fin 104a having the recess 114 thereon. In an example embodiment of the present invention, the anisotropic etching process for forming the spacers 112 and the anisotropic etching process for forming the recess 114 may be performed in-situ.

The epitaxial pattern 116 may be formed to fill the recess 114. In an example embodiment of the present invention, a plurality of epitaxial patterns 116 may be arranged in the second direction, and neighboring ones of the epitaxial patterns 116 disposed in the second direction may be connected to each other to be merged into a single layer pattern. Particularly, a selective epitaxial growth (SEG) process may be performed using a surface portion of the active fin 104a exposed by the recess 114 as a seed to form the epitaxial patterns 116. Each of the epitaxial patterns 116 may be formed to have a cross-section taken along the second direction, of which a shape may be pentagon, hexagon, or rhombus.

In an example embodiment of the present invention, the epitaxial patterns 116 may be formed of silicon-germanium.

In an example embodiment of the present invention, when the SEG process is performed, p-type impurities may be doped in-situ into the epitaxial patterns 116. Thus, the epitaxial pattern 116 may serve as source/drain regions of the p-type FinFET.

In an example embodiment of the present invention, after forming the epitaxial patterns 116, p-type impurities may be further implanted into the active fin 104a, and the substrate 100 may be annealed.

In some example embodiments of the present invention, the recess 114 and the epitaxial patterns 116 may not be formed. In this case, the p-type impurities may be implanted into an upper portion of the preliminary active fin 104, which is adjacent to the first and second mold structures 109a and 109b, to form source/drain regions of the p-type FinFET.

A first insulating interlayer 118 covering the first and second mold structures 109a and 109b, the spacers 112, the epitaxial patterns 116 and the isolation layer 106 may be formed on the substrate 100, and an upper portion of the first insulating interlayer 118 may be planarized until the top surfaces of the mold gate electrode 108b being exposed. In an example embodiment of the present invention, the planarization process may be performed by a CMP process and/or an etch back process.

In an example embodiment of the present invention, the hard mask 108c may be removed by the planarization process. In some example embodiments of the present invention, the hard mask 108c may partially remain on the mold gate electrode 108b.

Figure 7:
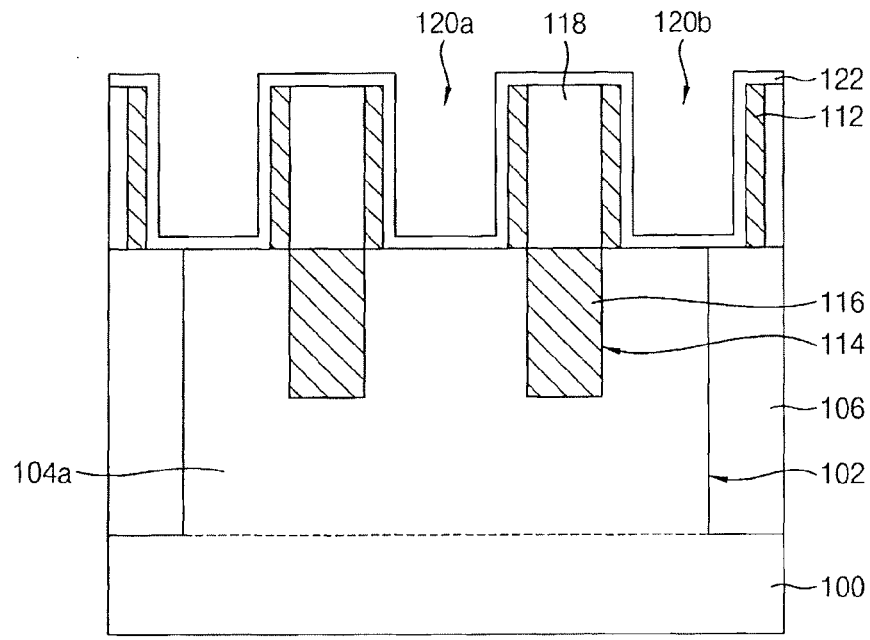

Referring to FIG. 7, the first and second mold structures 109a and 109b may be isotropically etched to form first and second openings 120a and 120b, respectively. A surface of the substrate 100 may be exposed by the first and second openings 120a and 120b.

A gate insulation layer 122 may be conformally formed on sidewalls of the first and second openings 120a and 120b, the exposed top surface of the substrate 100, and a top surface of the first insulating interlayer 118. The gate insulation layer 122 may be formed of a metal oxide having a dielectric constant higher than a dielectric constant of silicon nitride. The gate insulation layer 122 may include, e.g., hafnium oxide, tantalum oxide, zirconium oxide, etc.

In an example embodiment of the present invention, before forming the gate insulation layer 122, an interface pattern may be further formed on the exposed top surface of the substrate 100 exposing by the first and second openings 120a and 120b. The interface layer may be formed of, e.g., an oxide.

Figure 8:
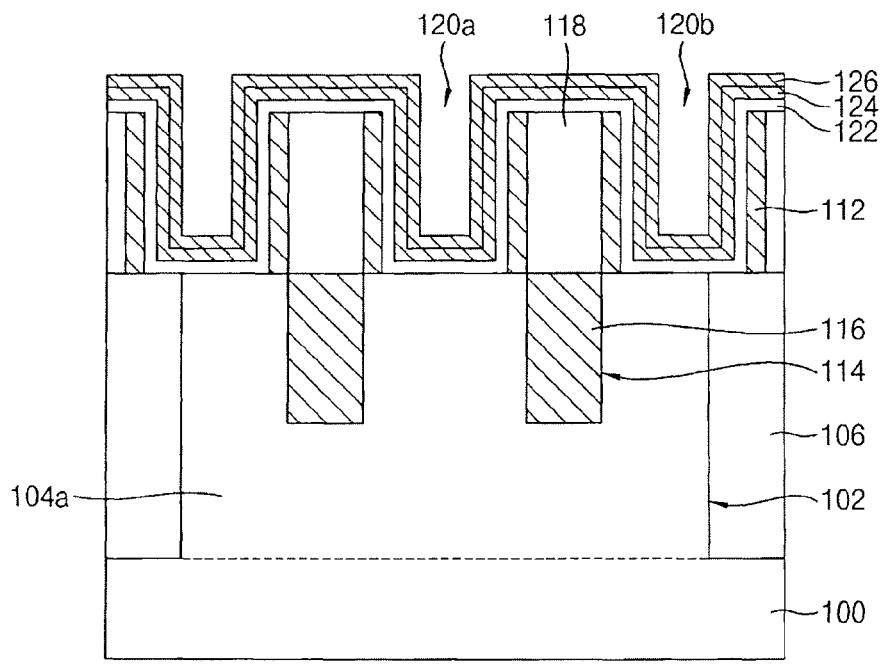

Referring to FIG. 8, a threshold voltage control layer 124 and a barrier layer 126 may be sequentially fixated on the gate insulation layer 122.

The threshold voltage control layer 124 may be formed to adjust a threshold voltage of the p-type FinFET. The threshold voltage control layer 124 may be formed of a metal or a metal alloy having a work function higher than about 4.5 eV. For example, the threshold voltage control layer 124 may include titanium, titanium nitride, titanium aluminum nitride, etc. In an example embodiment of the present invention, the threshold voltage control layer 124 may include titanium. The threshold voltage of the p-type FinFET may be controlled by a combination of the metals included in the threshold voltage control layer 124.

The barrier layer 126 may be formed of, e.g., titanium, titanium nitride, etc. In an example embodiment of the present invention, the barrier layer 126 may include titanium.

In some example embodiments of the present invention, the barrier layer 126 may not be formed. In some example embodiments of the present invention, the barrier layer 126 may be formed of, e.g., tantalum, tantalum nitride, etc.

In an example embodiment of the present invention, the threshold voltage control layer 124 and the barrier layer 126 may be formed by a CVD process or an ALD process. In an example embodiment of the present invention, the threshold voltage control layer 124 and the barrier layer 126 may be formed in-situ.

Figure 9:
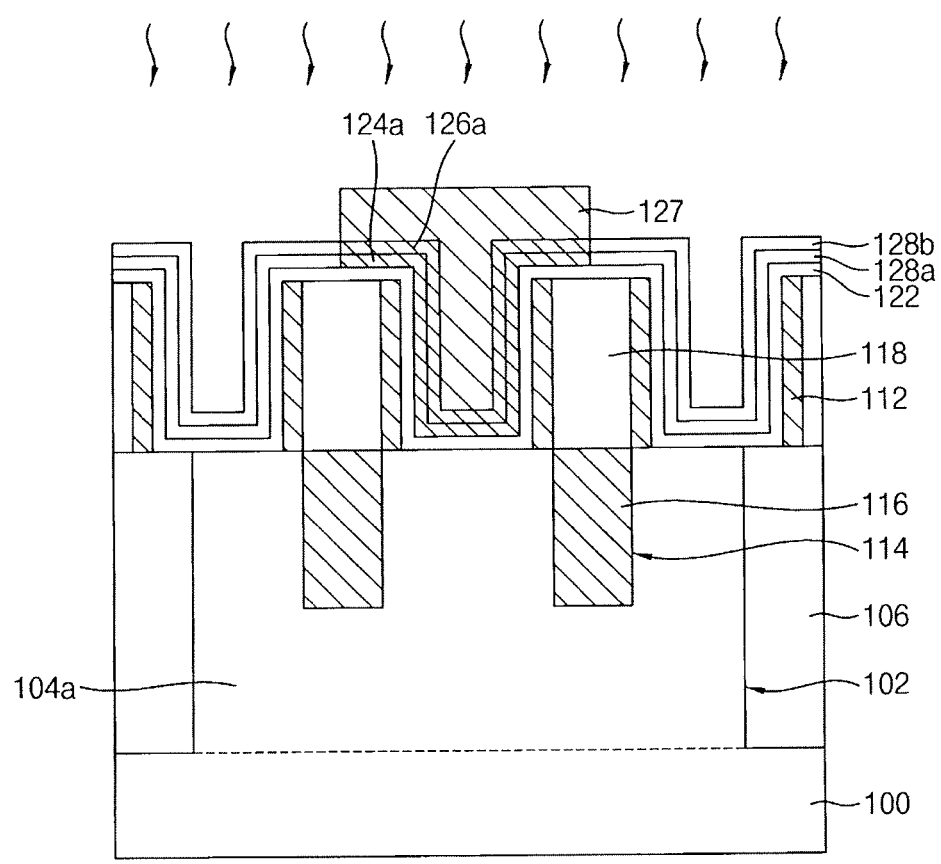

Referring to FIG. 9, a mask pattern 127 may be formed on the barrier layer 126 to overlap a portion of the substrate 100 corresponding to the gate structure 140. The exposed barrier layer 126 and the threshold voltage control layer 124 under the barrier layer 126 may be oxidized to form a second stressor layer 128b and a first stressor layer 128a, respectively.

The mask pattern 127 may cover the first opening 120a and a portion of the barrier layer 126 adjacent to the first opening 120a. The mask pattern 127 may include, e.g., a spin on hard (SOH) mask, a hard mask, a photoresist pattern, etc.

The first and second stressor layers 128a and 128b may be formed on the gate insulation layer 122 to overlap a portion of the substrate 100 corresponding to the dummy gate structure 142. The first stressor layer 128a may be formed by oxidizing titanium in the threshold voltage control layer 124, and the second stressor layer 128b may be formed by oxidizing titanium in the barrier layer 126. Thus, the first and second stressor layers 128a and 128b may include titanium oxide. The titanium oxide in the first and second stressor layers 128a and 128b may apply a compressive stress onto a channel region of the p-type Fin FET.

The oxidation process for forming the first and second stressor layers 128a and 128b may be performed at a temperature less than about 500□, preferably, in a range of about 100□ to about 500□. The oxidation process may include a plasma oxidation process. Thus, the threshold voltage control layer 124a and the barrier layer 126a overlapping the portion of the substrate 100 corresponding to the gate structure 140, and the first and second stressor layers 128a and 128b overlapping the portion of the substrate 100 corresponding to the dummy gate structure 142 may be formed.

Figure 10:
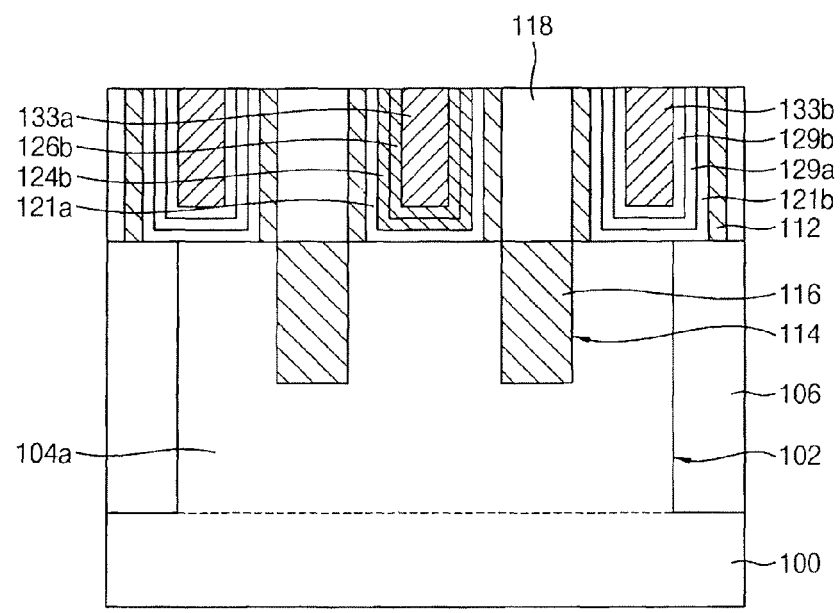

Referring to FIG. 10, the mask pattern 127 may be removed. A first preliminary gate insulation pattern 121a, a preliminary threshold voltage control pattern 124b, a preliminary barrier pattern 126b and a first preliminary gate electrode 133a may be formed in the first opening 120a, and a second preliminary gate insulation pattern 121b, a first preliminary stressor pattern 129a, a second preliminary stressor pattern 129b, and a second preliminary gate electrode 133b may be formed in the second opening 120b. Particularly, a gate electrode layer may be formed on the threshold voltage control layer 124a, the barrier layer 126a and first and second stressor layers 128a and 128b to fill the first and second openings 120a and 120b. The gate electrode layer may be formed of a metal having a low resistance, e.g., aluminum (Al), copper (Cu), tantalum (Ta), etc., or a metal nitride thereof. The gate electrode layer may be formed by an ALD process or a physical vapor deposition (PVD) process.

The gate electrode layer, the threshold voltage control layer 124a, the barrier layer 126a, the first and second preliminary stressor layers 128a and 128b and the gate insulation layer 122 may be planarized until a top surface of the first insulating interlayer 118 being exposed. In an example embodiment of the present invention, the planarization process may be performed by a CMP process and/or an etch back process. Thus, the first preliminary gate insulation pattern 121a, the preliminary threshold voltage control pattern 124b, the preliminary barrier pattern 126b and the first preliminary gate electrode 133a may be formed in the first opening 120a, and the second preliminary gate insulation pattern 121b, the first preliminary stressor pattern 129a, the second preliminary stressor pattern 129b and the second preliminary gate electrode 133b may be formed in the second opening 120b.

Referring to FIG. 11, upper portions of the first and second preliminary gate insulation patterns 121a and 121b, the preliminary threshold voltage control pattern 124b, the preliminary barrier pattern 126b, the first and second preliminary gate electrodes 133a and 133b, and the first and second preliminary stressor patterns 129a and 129b in the first and second openings 120a and 120b may be partially etched to form recesses. A hard mask layer may be formed to fill the recesses. The hard mask layer may be planarized until the top surface of the first insulating interlayer 118 being exposed to form a first hard mask 136a and a second hard mask 136b in the first opening 120a and the second opening 120b, respectively. Thus, a first gate insulation pattern 122b, a threshold voltage control pattern 124c, a barrier pattern 126c, a first gate electrode 134a and the first hard mask 136a sequentially stacked may form the gate structure 140 in the first opening 120a. A second gate insulation pattern 122c, a first stressor pattern 130a, a second stressor pattern 130b, a second gate electrode 134b and the second hard mask 136b sequentially stacked may form the dummy gate structure 142 in the second opening 120b.

In an example embodiment of the present invention, the first gate insulation pattern 122b may include a material substantially the same as the material of the second gate insulation pattern 122c, and the first gate electrode 134a may include a material substantially the same as the material of the second gate electrode 134b. The first hard mask 136a may include a material substantially the same as the material of the second hard mask 136b.

FIGS. 12 to 15 are cross-sectional views illustrating stages of a method of manufacturing a semiconductor device in accordance with an example embodiment of the present invention.

Figure 12:
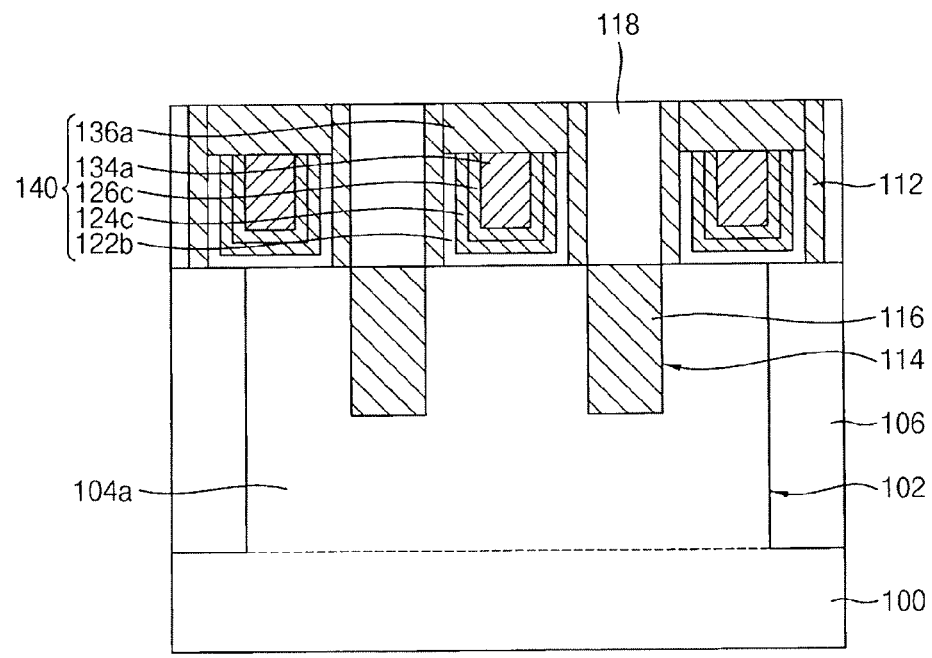
FIGS. 12 and 15 are cross-sectional views illustrating the semiconductor device in accordance with an example embodiment of the present invention.

Referring to FIG. 12, first, processes substantially the same as or similar to the processes illustrated with reference to FIGS. 5 to 8 may be performed. Then, processes substantially the same as or similar to the processes illustrated with reference to FIGS. 10 and 11 may be performed without performing the process illustrated with reference to FIG. 9. Thus, the first gate insulation pattern 122b, the threshold voltage control pattern 124c, the barrier pattern 126c, the first gate electrode 134a, and the first hard mask 136a may be formed in each of the first and second openings 120a and 120b.

Figure 13:
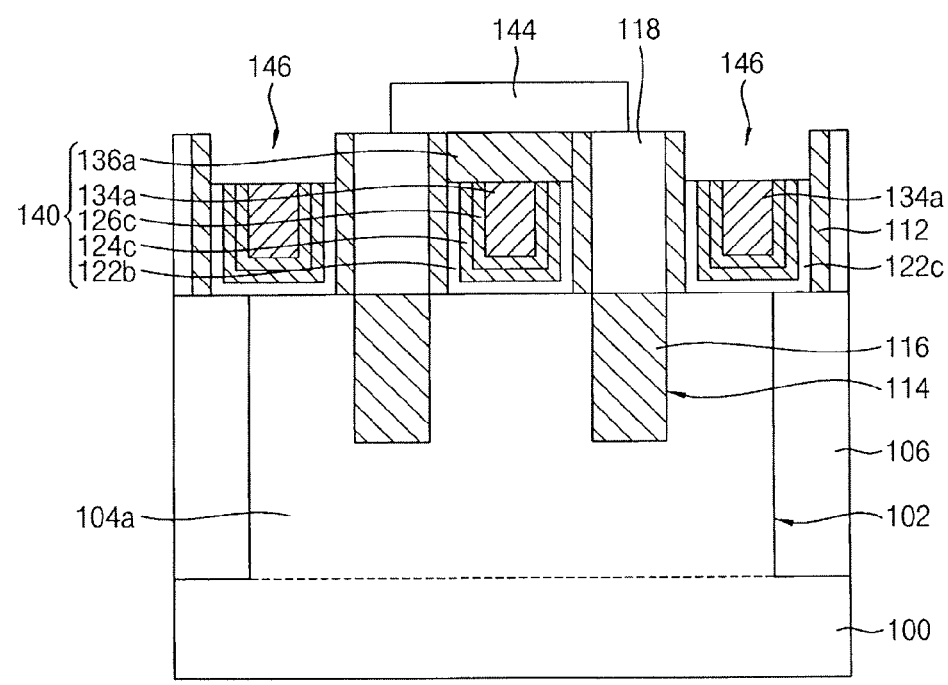

Referring to FIG. 13, a mask pattern 144 may be formed on the first hard mask 136a, the spacer 112 and the first insulating interlayer 118 to overlap a portion of the substrate 100 corresponding to the gate structure 140.

The first hard mask 136a overlapping the portion of the substrate 100 corresponding to the gate structure 140 may be selectively etched using the mask pattern 144 as an etching mask to form a third opening 146. That is, the first hard mask 136a in the second opening 120b may be selectively etched.

In an example embodiment of the present invention, when the first hard mask 136a and the spacer 112 have substantially the same material as each other, an exposed portion of the spacer 112 may be partially etched during etching the first hard mask 136a. Particularly, the second gate insulation pattern 122c, the threshold voltage control pattern 124c, the barrier pattern 126c and the first gate electrode 134a may be exposed by the third opening 146.

Figure 14:
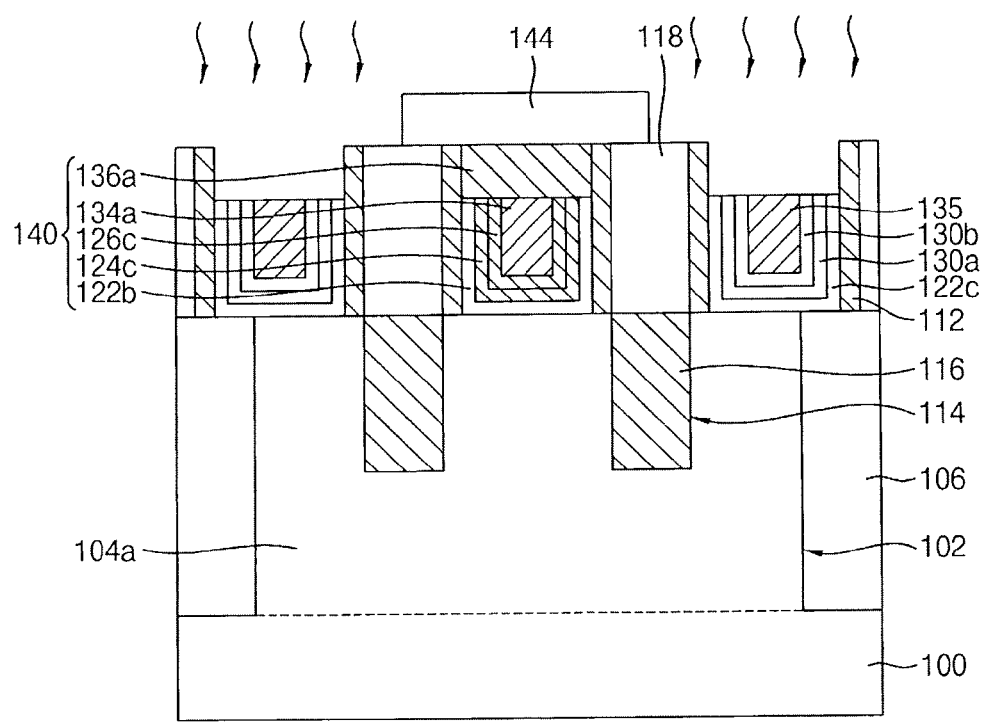

Referring to FIG. 14, the exposed threshold voltage control pattern 124c and the barrier pattern 126c may be oxidized to form a first stressor pattern 130a and a second stressor pattern 130b, respectively. The first and second stressor patterns 130a and 130b may include, e.g., titanium oxide.

The first and second stress patterns 130a and 130b may apply a compressive stress onto a channel region of the p-type Fin FET.

In the oxidation process, the exposed first gate electrode 134a may be oxidized to form a second gate electrode 135. The second gate electrode 135 may include a metal oxide.

The oxidation process for forming the first and second stressor patterns 130a and 130b may be performed at a temperature less than about 500□, preferably, in a range of about 100□ to about 500□. The oxidation process may include a plasma oxidation process.

Figure 15:
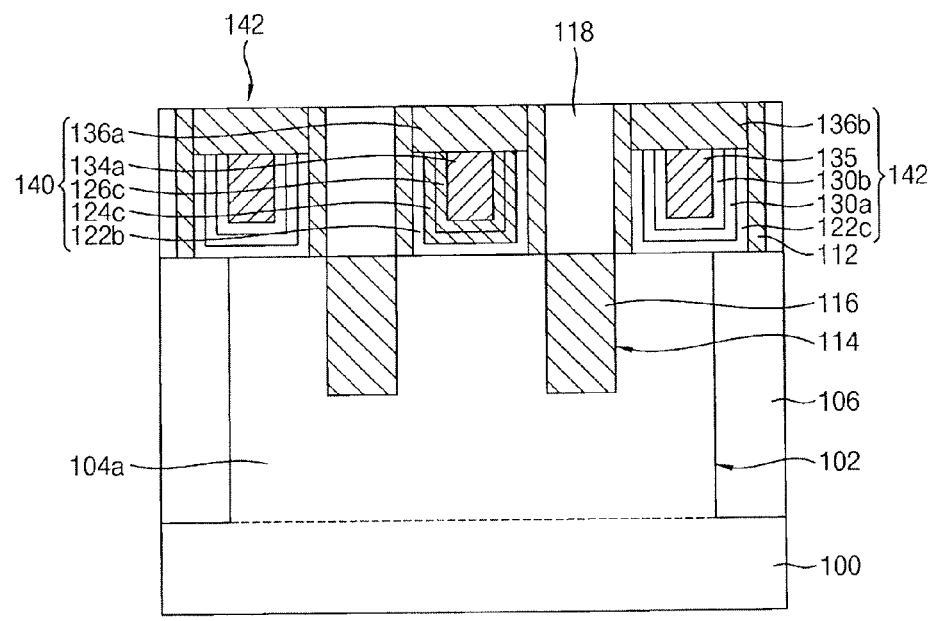

Referring to FIG. 15, a hard mask layer may be formed to fill the third opening 146, and may be planarized until the top surface of the first insulating interlayer 118 may be exposed to form a second hard mask 136b in the second opening 120b. Thus, a first gate insulation pattern 122b, a threshold voltage control pattern 124c, a barrier pattern 126c, a first gate electrode 134a and the first hard mask 136a sequentially stacked may form the gate structure 140 in the first opening 120a. A second gate insulation pattern 122c, a first stressor pattern 130a, a second stressor pattern 130b, the second gate electrode 135 and the second hard mask 136b sequentially stacked may form a dummy gate structure 142 in the second opening 120b.

In an example embodiment of the present invention, the first gate insulation pattern 122b may include a material substantially the same as the material of the second gate insulation pattern 122c. The first hard mask 136a may include a material substantially the same as or different from the material of the second hard mask 136b. The first gate electrode 134a may include a material different from the material of the second gate electrode 135.

Figure 16:
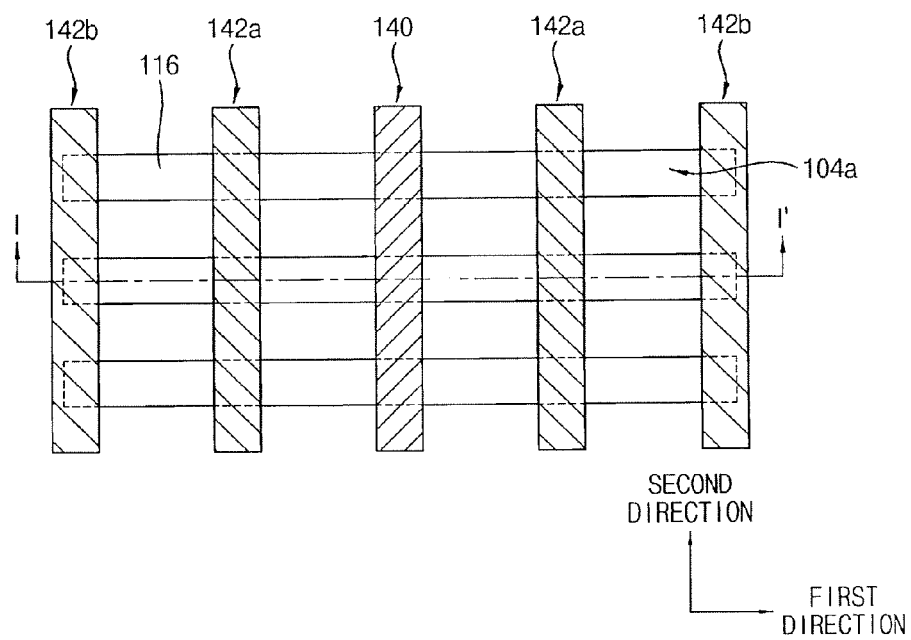
FIGS. 16 and 17 are a plan view and a cross-sectional view illustrating a semiconductor device in accordance with an example embodiment of the present invention.
Figure 17:
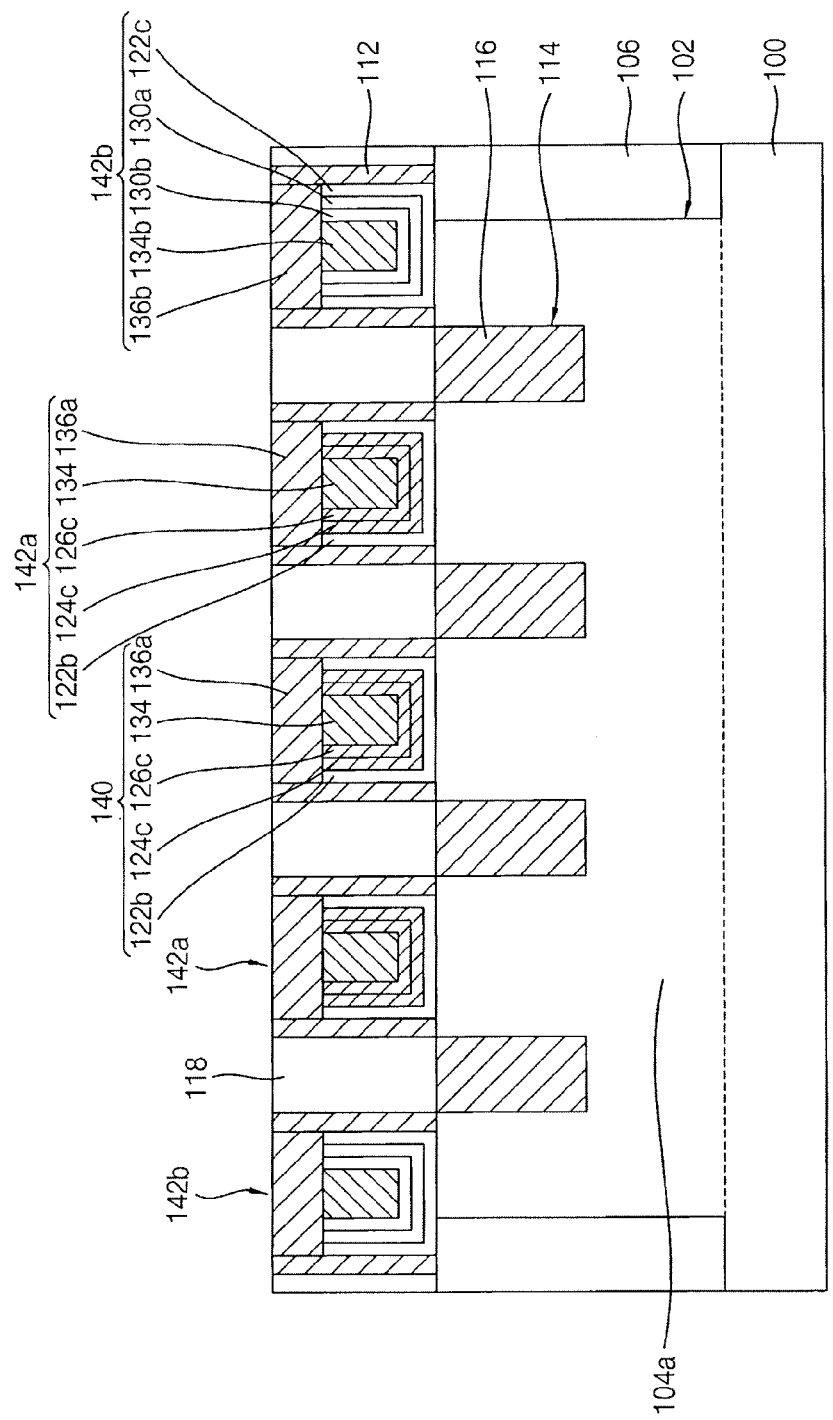

FIGS. 16 and 17 are a plan view and a cross-sectional view, respectively, illustrating a semiconductor device in accordance with an example embodiment of the present invention. FIG. 17 is a cross-sectional view taken along a line I-I' of FIG. 16, The semiconductor device may be substantially the same as or similar to the semiconductor device of FIGS. 1 to 4, except for a dummy gate structure.

Referring to FIGS. 16 and 17, a gate structure 140 and first and second dummy gate structures 142a and 142b neighboring the gate structure 140 in a first direction may be formed on a substrate 100. Spacers 112 may be formed on sidewalls of the gate structure 140 and sidewalls of each of the first and second dummy gate structures 142a and 142b.

A plurality of active fins 104a may protrude upwardly from a surface of the substrate 100, and each of the active fins 104a may extend in the first direction. The gate structure 140 and the first and second dummy gate structures 142a and 142b may extend in a second direction substantially perpendicular to the first direction, and may be formed on the active fin 104a. Each of the active fins 104a may include a plurality of recesses 114 thereon. An epitaxial pattern 116 may be formed in each of the recesses 114. The epitaxial pattern 116 may serve as source/drain regions of a p-type FinFET.

The first dummy gate structure 142a may be spaced apart from the gate structure 140 in the first direction, and may be adjacent to the gate structure 140. In an example embodiment of the present invention, at least one of the first dummy gate structures 142a may be adjacent to each of opposite sidewalls of the gate structure 140.

The gate structure 140 in FIGS. 16 and 17 may be substantially the same as the gate structure 140 illustrated with reference to FIGS. 1 to 4, and the first dummy gate structure 142a may be substantially the same as the gate structure 140. That is, the gate structure 140 and the first dummy gate structure 142a may include a first gate insulation pattern 122b, a threshold voltage control pattern 124c, a barrier pattern 126c, a first gate electrode 134a and a first hard mask 136a.

The first dummy gate structure 142a may not serve as a gate of the p-type FinFET. The first dummy gate structure 142a may prevent not-etching, over-etching, dishing, etc., when the gate structure 140 is formed by a photolithography process and/or a polishing process.

The second dummy gate structure 142b may be adjacent to one side of the first dummy gate structures 142a farthest from the sidewalls of the gate structure 140. In an example embodiment of the present invention, a plurality of the second dummy gate structures 142b may be formed. As shown in FIG. 17, a bottom portion of one side of the second dummy gate structures 142b farthest from the sidewalls of the gate structure 140 may overlap with a top surface of the isolation layer 106.

The second dummy gate structure 142b may include a second gate insulation pattern 122c, a first stressor pattern 130a, a second stressor pattern 130b, a second gate electrode 134b and a second hard mask 136b. The second dummy gate structure 142b in FIGS. 16 and 17 may be substantially the same as the dummy gate structure 142 illustrated with reference to FIGS. 1 to 4. That is, the first and second stressor patterns 130a and 130b may include titanium oxide. Thus, the first and second stressor patterns 130a and 130b in the second dummy gate structure 142b may apply a compressive stress onto a channel region under the gate structure 140, and consequently the p-type FinFET having good electrical characteristics may be obtained.

The semiconductor device may be manufactured by performing the processes substantially the same as or similar to the processes illustrated with reference to FIGS. 5 to 11. However, the first dummy gate structure 142a substantially the same as the gate structure 140 may be further formed to be adjacent to the gate structure 140.

Figure 18:
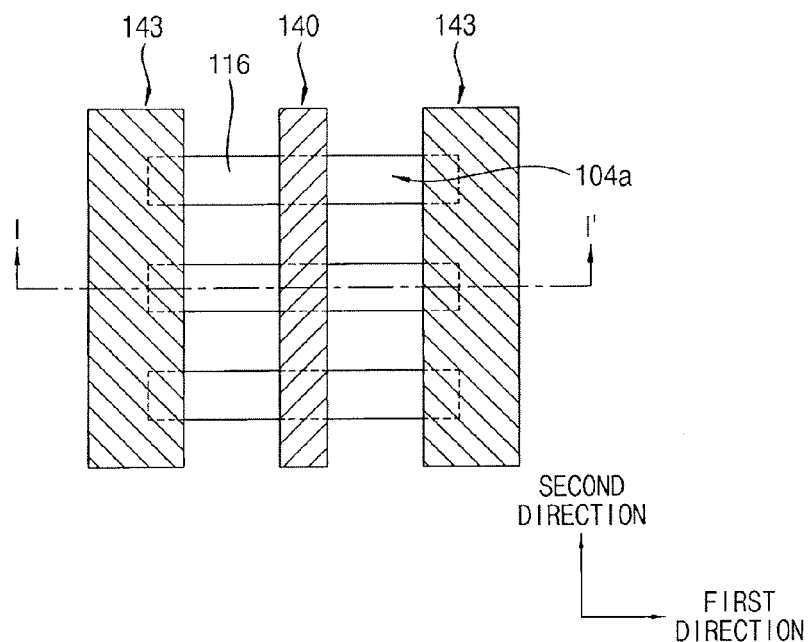
FIGS. 18 and 19 are a plan view and a cross-sectional view illustrating a semiconductor device in accordance with an example embodiment of the present invention.
Figure 19:
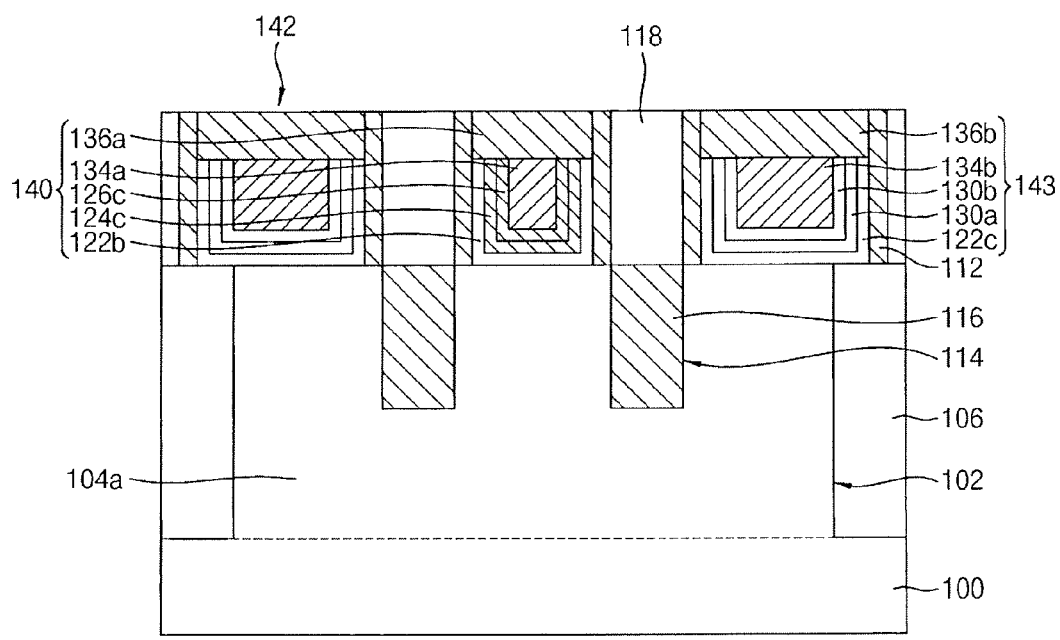

FIGS. 18 and 19 are a plan view and a cross-sectional view, respectively, illustrating a semiconductor device in accordance with an example embodiment of the present invention. FIG. 19 is a cross-sectional view taken along a line I-I' of FIG. 18, The semiconductor device may be substantially the same as or similar to the semiconductor device of FIGS. 1 to 4, except for a different width of a dummy gate structure.

Referring to FIGS. 18 and 19, a gate structure 140 and dummy gate structures 143 neighboring the gate structure 140 in a first direction may be formed on a substrate 100. Spacers 112 may be formed on sidewalls of the gate structure 140 and sidewalls of the dummy gate structures 143.

The gate structure 140 in FIGS. 18 and 19 may be substantially the same as the gate structure 140 illustrated with reference to FIGS. 1 to 4.

The dummy gate structure 143 may have a stacked structure substantially the same as the stacked structure of the dummy gate structure 142 illustrated with reference to FIGS. 1 to 4. However, the dummy gate structure 143 may have a width in the first direction greater than the width in the first direction of the gate structure 140.

The first and second stressor patterns 130a and 130b in the dummy gate structure 143 may apply a compressive stress onto the channel region under the gate structure 140.

As the width in the first direction of the dummy gate structure 143 may be relatively wider, the volume of the second gate electrode 134b in the dummy gate structure 143 may become larger. The second gate electrode 134b may include a metal, which may apply a compressive stress onto the channel region under the gate structure 140. Thus, the compressive stress may be controlled by the width in the first direction of the dummy gate structure 143.

The semiconductor device may be manufactured by performing processes substantially the same as or similar to the processes illustrated with reference to FIGS. 5 to 11. However, the first dummy gate structure 143 may be formed to have the width in the first direction greater than the width in the first direction of the gate structure 140.

Figure 20:
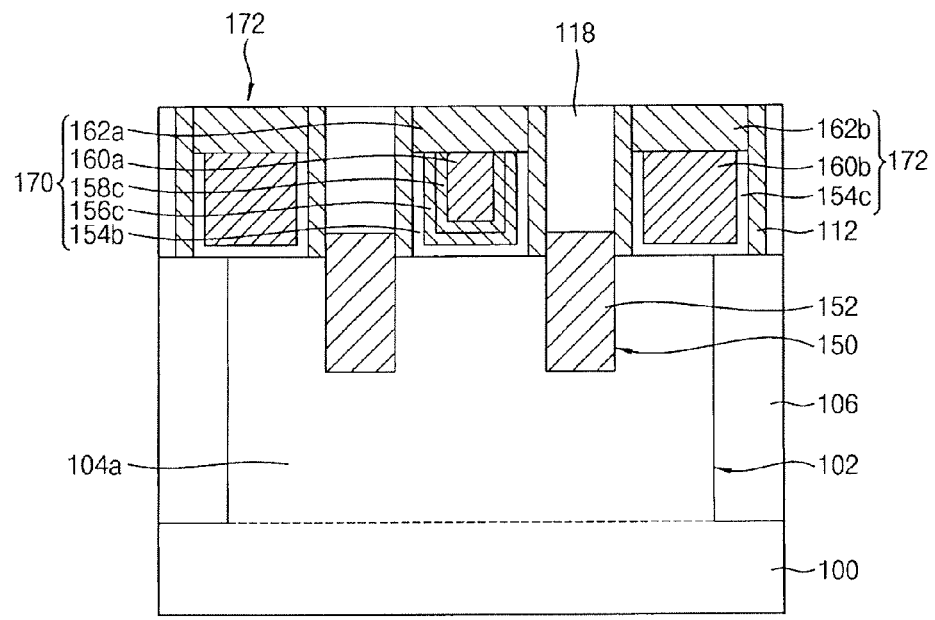
FIGS. 20 and 21 are cross-sectional views illustrating a semiconductor device in accordance with an example embodiment of the present invention.
Figure 21:
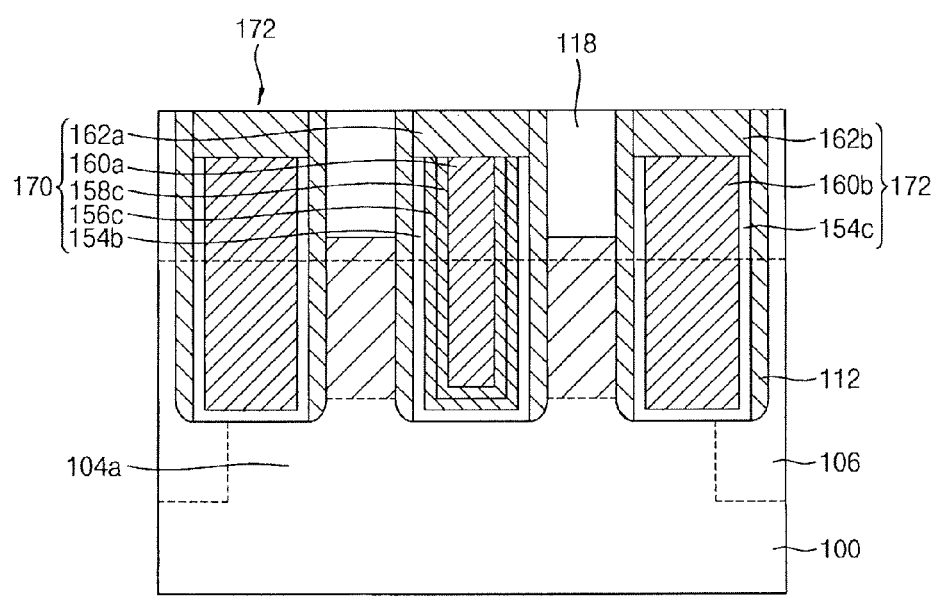

FIGS. 20 and 21 are cross-sectional views illustrating a semiconductor device in accordance with an example embodiment of the present invention. FIGS. 20 and 21 are cross-sectional views taken along lines I-I' and II-II', respectively, of FIG. 1.

In an example embodiment of the present invention, the semiconductor device may include an n-type FinFET. The semiconductor device may be substantially the same as or similar to the semiconductor device of FIGS. 1 to 4, except for a gate structure, a dummy gate structure and source/drain regions.

Referring to FIGS. 20 and 21, a gate structure 170 and dummy gate structures 172 neighboring the gate structure 170 in a first direction may be formed on a substrate 100. The gate structure 170 may have a stacked structure different from a stacked structure of the dummy gate structure 172. Spacers 112 may be formed on sidewalls of the gate structure 170 and sidewalls of the dummy gate structures 172.

A plurality of active fins 104a may be formed, and may protrude upwardly from a surface of the substrate 100. An isolation layer 106 may be formed between the active fins 104a. Each of the active fins 104a may include a plurality of recesses 150 thereon.

The gate structure 170 may extend in the second direction, and may be formed on sidewalls and a top surface of the active fin 104a. The gate structure 170 may serve as a gate of the n-type FinFET.

The gate structure 170 may be formed on the active fin 104a and the isolation layer 106. The gate structure 170 may include a first gate insulation pattern 154b, a threshold voltage control pattern 156c, a barrier pattern 158c, a first gate electrode 160a and a first hard mask 162a sequentially stacked. The first gate insulation pattern 154b, the first gate electrode 160a and the first hard mask 162a may be substantially the same as the first gate insulation pattern 122b, the first gate electrode 134a and the first hard mask 136a illustrated with reference to FIGS. 1 to 4, respectively.

The threshold voltage control pattern 156c may adjust a threshold voltage of the n-type FinFET. The threshold voltage control pattern 156c may include a metal or a metal alloy having a work function less than about 4.5 eV. For example, the threshold voltage control pattern 156c may include titanium, titanium nitride, titanium aluminum nitride, etc. In an example embodiment of the present invention, the threshold voltage control pattern 156c may include titanium. The work function may be controlled by a combination of metals included in the threshold voltage control pattern 156c. For example, the barrier pattern 158c may include titanium, titanium nitride, etc. In an example embodiment of the present invention, the barrier pattern 158c may include titanium.

In some example embodiments of the present invention, the barrier pattern 158c may not be formed. In some example embodiments of the present invention, the barrier pattern 158c may include, e.g., tantalum, tantalum nitride, etc.

The dummy gate structure 172 may include a second gate insulation pattern 154c, a second gate electrode 160b and a second hard mask 162b sequentially stacked. The dummy gate structure 172 may exclude the threshold voltage control pattern 156c and the barrier pattern 158c of the gate structure 170. Thus, the second gate insulation pattern 154c may directly contact the second gate electrode 160b. That is, no stressor patterns which contain titanium or titanium oxide are included in the dummy gate structure 172. Without the stressor patterns in the dummy gate structure 172, the compressive stress applied to the substrate 100 may be less, and consequently the degradation of the electrical performance of the n-type FinFET due to the compressive stress may be substantially reduced. The recess 150 may be formed at an upper portion of the active fin 104a between the spacers 112. An epitaxial pattern 152 may be formed in the recess 150.

In an example embodiment of the present invention, a top surface of the epitaxial pattern 152 may be higher than a top surface of the active fin 104a. The epitaxial pattern 152 may be doped with n-type impurities, so that the epitaxial pattern 152 may serve as source/drain regions of the n-type FinFET. The epitaxial pattern 152 may include silicon. In an example embodiment of the present invention, the recess may not be formed at an upper portion of the active fin 104a, and thus the epitaxial pattern 152 may not be formed. In this case, the active fin 104a adjacent to the gate structure 170 may be doped with n-type impurities, which may serve as source/drain regions of the n-type FinFET. A metal silicide pattern may be further formed on the epitaxial pattern 152. A first insulating interlayer 118 may fill a space between the gate structure 170 and the dummy gate structure 172. A second insulating interlayer may be further formed on the gate structure 170, the dummy gate structure 172 and the first insulating interlayer 118. A wiring structure may be formed through the first insulating interlayer 118 and the second insulating interlayer, and may be electrically connected with the source/drain regions of the epitaxial pattern 152. The wiring structure may include a contact plug and a wiring pattern on the contact plug. The contact plug may be self-aligned with the spacer 112, so that a sidewall of the contact plug may contact the spacer 112.

In an example embodiment of the present invention, as shown in FIG. 16, a plurality of first dummy structures may be further formed between the gate structure 170 and the dummy gate structure 172, in the n-type FinFET. The first dummy gate structure may be substantially the same as the gate structure 170.

In an example embodiment of the present invention, as shown in FIG. 18, a width in the first direction of the dummy gate structure 172 may be greater than the width in the first direction of the gate structure 170, in the n-type FinFET.

As described above, the semiconductor device may exclude stressor patterns which include titanium or titanium oxide in the dummy gate structure 172. Thus, the compressive stress applied onto the channel region of the n-type FinFET may be reduced, and consequently the n-type FinFET having good electrical characteristics may be obtained.

FIGS. 22 to 27 are cross-sectional views illustrating stages of a method of manufacturing a semiconductor device in accordance with an example embodiment of the present invention.

First, processes substantially the same as or similar to the processes illustrated with reference to FIG. 5 may be performed.

Figure 22:
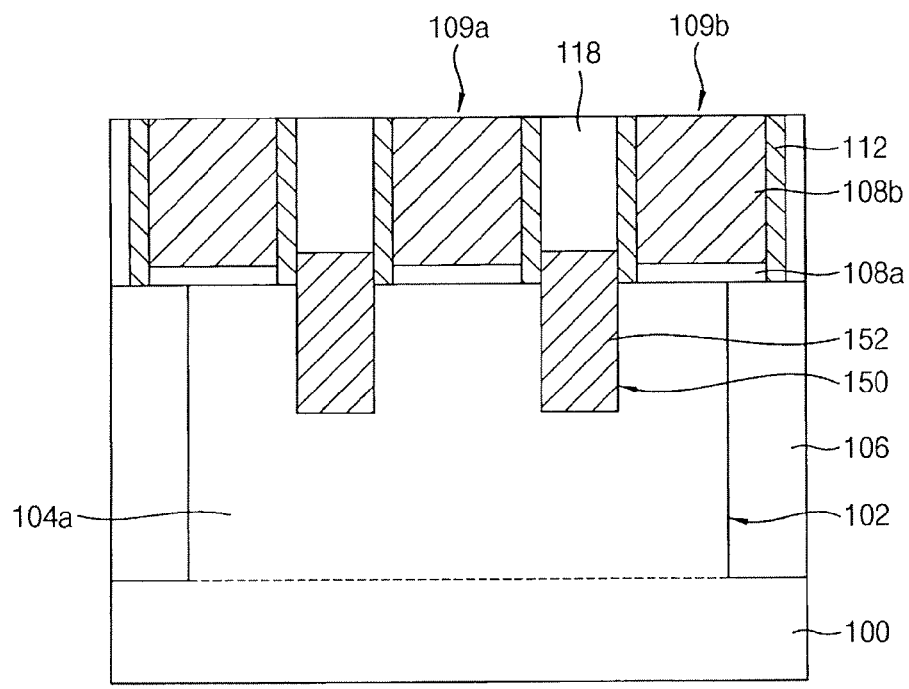
FIGS. 22 to 27 are cross-sectional views illustrating stages of a method of manufacturing the semiconductor device in accordance with an example embodiment of the present invention.

Referring to FIG. 22, a recess 150 may be formed between the spacers 112, and an epitaxial pattern 152 may be formed to fill the recess 150. A first insulating interlayer 118 may be formed to fill a space between the first and second mold structures 109a and 109b.

In an example embodiment of the present invention, the epitaxial pattern 152 may be formed of silicon. The epitaxial pattern 152 may be formed to have a top surface substantially coplanar with or higher than a top surface of the active fin 104a.

In an example embodiment of the present invention, n-type impurities may be doped in-situ into the epitaxial pattern 152 during forming the epitaxial pattern 152. Thus, the epitaxial pattern 152 may serve as source/drain regions of the n-type FinFET.

In an example embodiment of the present invention, after forming the epitaxial pattern 152, n-type impurities may be further implanted into the active fin 104a, and the substrate 100 may be annealed.

In some example embodiments of the present invention, the recess 150 and the epitaxial pattern 152 may not be formed. In this case, the n-type impurities may be implanted into an upper portion of the active fin 104a adjacent to the first and second mold structures 109a and 109b to form source/drain regions of the n-type FinFET.

A first insulating interlayer 118 covering the first and second mold structures 109a and 109b, the spacer 112, the epitaxial pattern 104a and the isolation layer 106 may be formed on the substrate 100, and an upper portion of the first insulating interlayer 118 may be planarized until top surfaces of the mold gate electrode 108b being exposed. In an example embodiment of the present invention, the planarization process may be performed by a CMP process and/or an etch back process.

Figure 23:
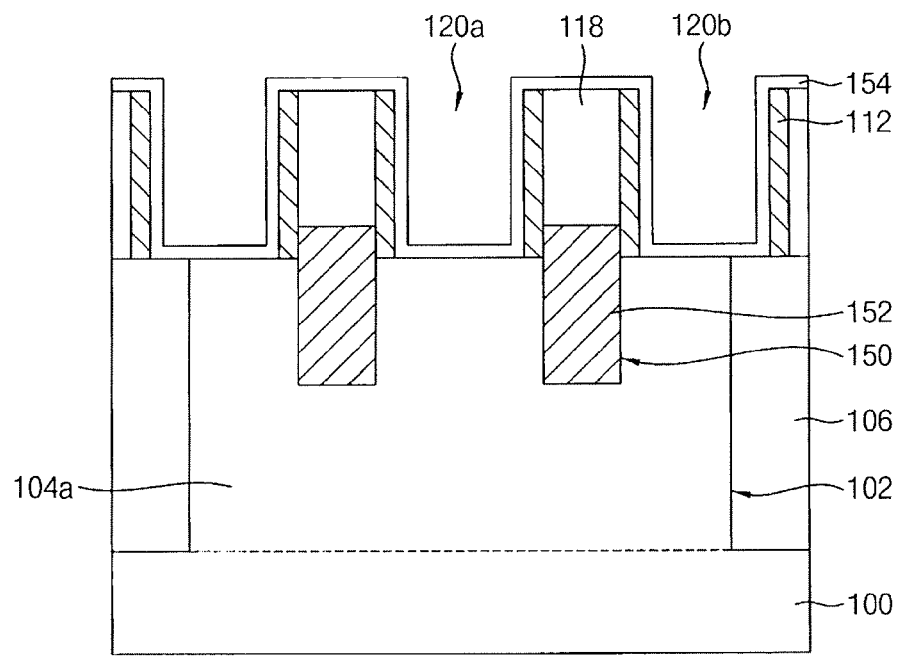

Referring to FIG. 23, the first and second mold structures 109a and 109b may be isotropically etched to form first and second openings 120a and 120b, respectively. A gate insulation layer 154 may be conformally formed on sidewalls and bottoms of the first and second openings 120a and 120b and top surfaces of the first insulating interlayer 118.

The process for removing of the first and second mold structures 109a and 109b and the process for forming the gate insulation layer 154 may be substantially the same as or similar to the processes illustrated with reference to FIG. 7.

Figure 24:
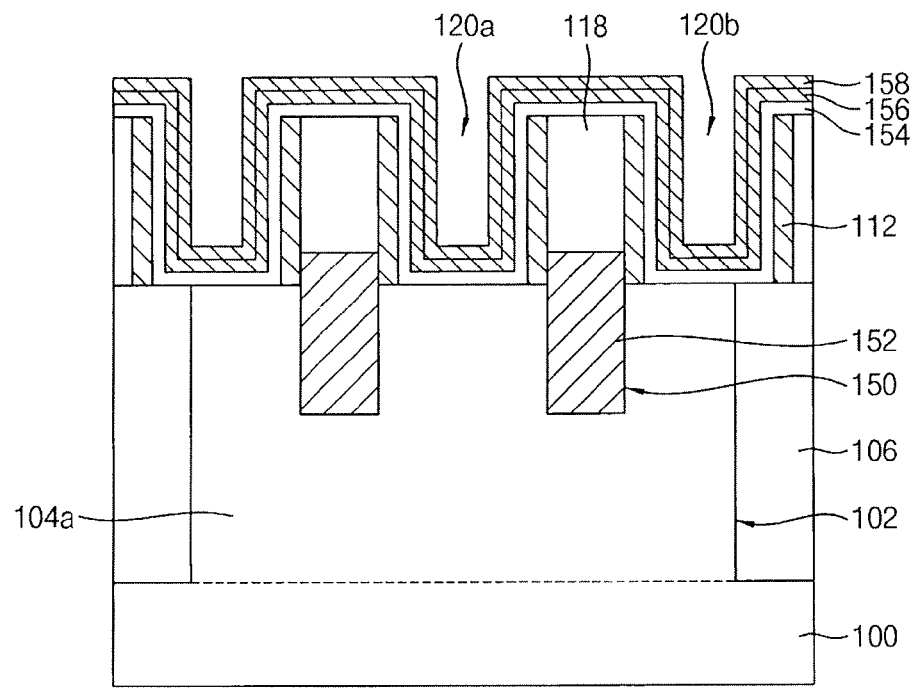

Referring to FIG. 24, a threshold voltage control layer 156 and a barrier layer 158 may be sequentially formed on the gate insulation layer 154.

The threshold voltage control layer 156 may be formed to adjust a threshold voltage of the n-type FinFET. The threshold voltage control layer 156 may be formed of a metal or a metal alloy having a work function less than about 4.5 eV. For example, the threshold voltage control layer 156 may include titanium, titanium nitride, titanium aluminum nitride, etc. In an example embodiment of the present invention, the threshold voltage control layer 156 may include titanium. The work function may be controlled by a combination of metals included in the threshold voltage control layer 156.

The barrier layer 158 may be formed of, e.g., titanium, titanium nitride, etc. In an example embodiment of the present invention, the barrier layer 158 may include titanium.

In some example embodiments of the present invention, the barrier layer 158 may not be formed. In some example embodiments of the present invention, the barrier layer 158 may be formed of, e.g., tantalum, tantalum nitride, etc.

In an example embodiment of the present invention, the threshold voltage control layer 156 and the barrier layer 158 may be formed by a CVD process or an ALD process. In an example embodiment of the present invention, the threshold voltage control layer 156 and the barrier layer 158 may be formed in-situ.

Figure 25:
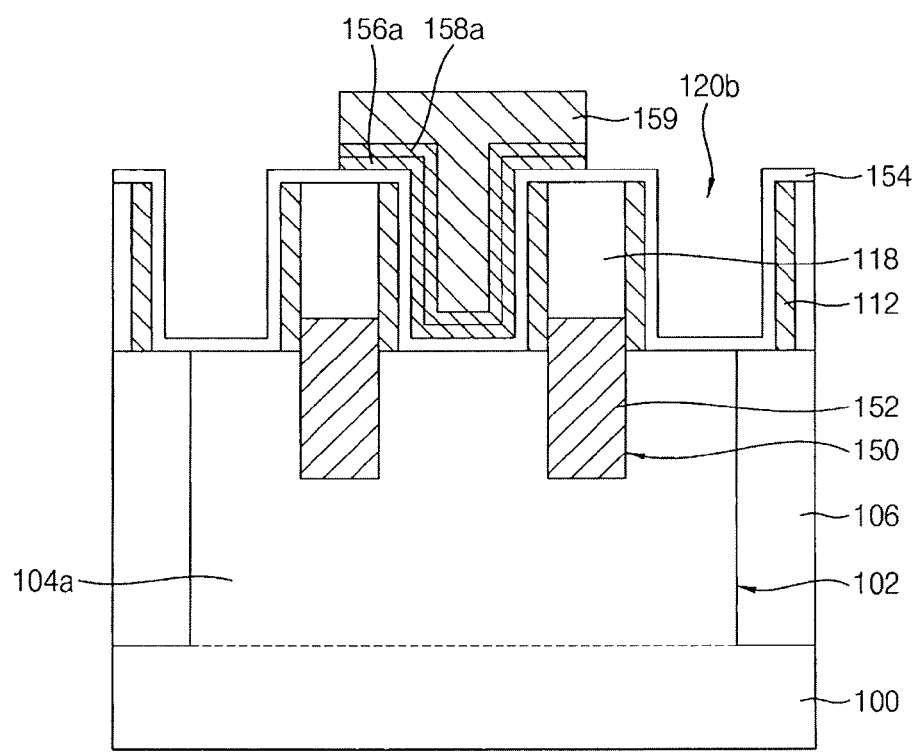
Figure 27:
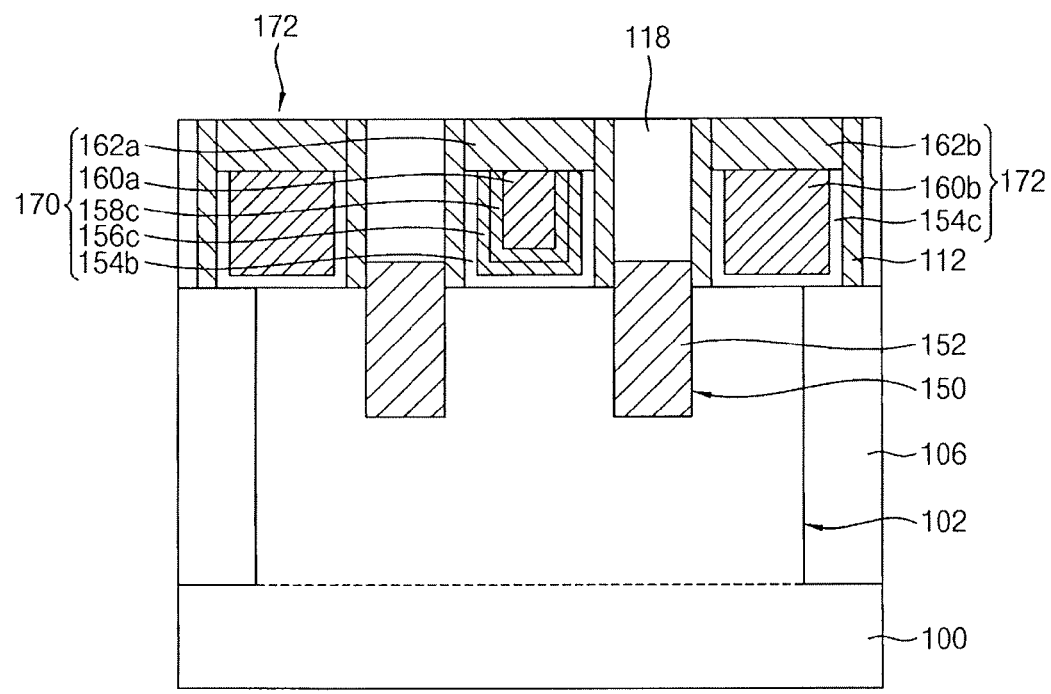

Referring to FIG. 25, a mask pattern 159 may be formed on the barrier layer 158 to overlap a portion of the substrate 100 corresponding to a gate structure 170 (refer to FIG. 27). The exposed barrier layer 158 and the threshold voltage control layer 156 under the barrier layer 158 may be removed to expose the gate insulation layer 154 overlapping a portion of the substrate 100 corresponding to a dummy gate structure 172 (refer to FIG. 27). Thus, the dummy gate structure 172 may not include titanium and titanium oxide. That is, the dummy gate structure 172 may exclude a stressor pattern for applying a compressive stress.

Figure 26:
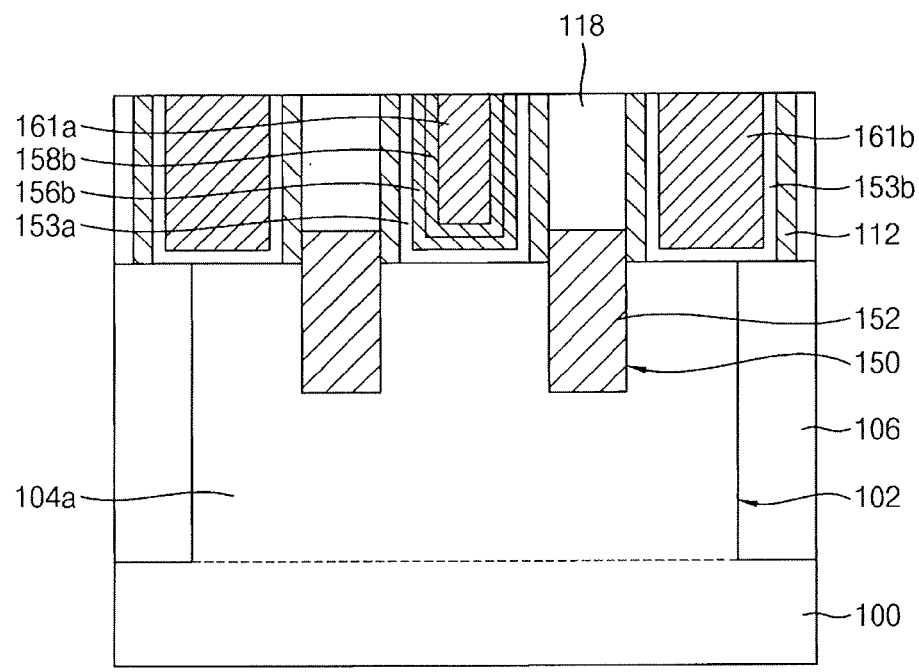

Referring to FIG. 26, the mask pattern 159 may be removed. A first preliminary gate insulation pattern 153a, a preliminary threshold voltage control pattern 156b, a preliminary barrier pattern 158b and a first preliminary gate electrode 161a may be formed in the first opening 120a, and a second preliminary gate insulation pattern 153b and a second preliminary gate electrode 161a may be formed in the second opening 120b.

The processes may be substantially the same as or similar to the processes illustrated with reference to FIG. 10.

Referring to FIG. 27, upper portions of the first and second preliminary gate insulation patterns 153a and 153b, the preliminary threshold voltage control pattern 156b, the preliminary barrier pattern 158b and the first and second preliminary gate electrodes 161a and 161b in the first and second openings 120a and 120b may be partially etched to form recesses. A hard mask layer may be formed to fill the recesses, and the hard mask layer may be planarized until the top surface of the first insulating interlayer 118 being exposed to form a first hard mask 162a and a second hard mask 162b in the first opening 120a and the second opening 120b, respectively. Thus, a first gate insulation pattern 154b, a threshold voltage control pattern 156c, a barrier pattern 158c, a first gate electrode 160a and the first hard mask 162a sequentially stacked may form the gate structure 170 in the first opening 120a. A second gate insulation pattern 154c, a second gate electrode 160b and the second hard mask 162b sequentially stacked may form the dummy gate structure 172 in the second opening 120b.

In an example embodiment of the present invention, the first and second gate insulation patterns 154b and 154c may include substantially the same material, the first and second gate electrodes 160a and 160b may include substantially the same material, and the first and second hard masks 162a and 162b may include substantially the same material.

Figure 28:
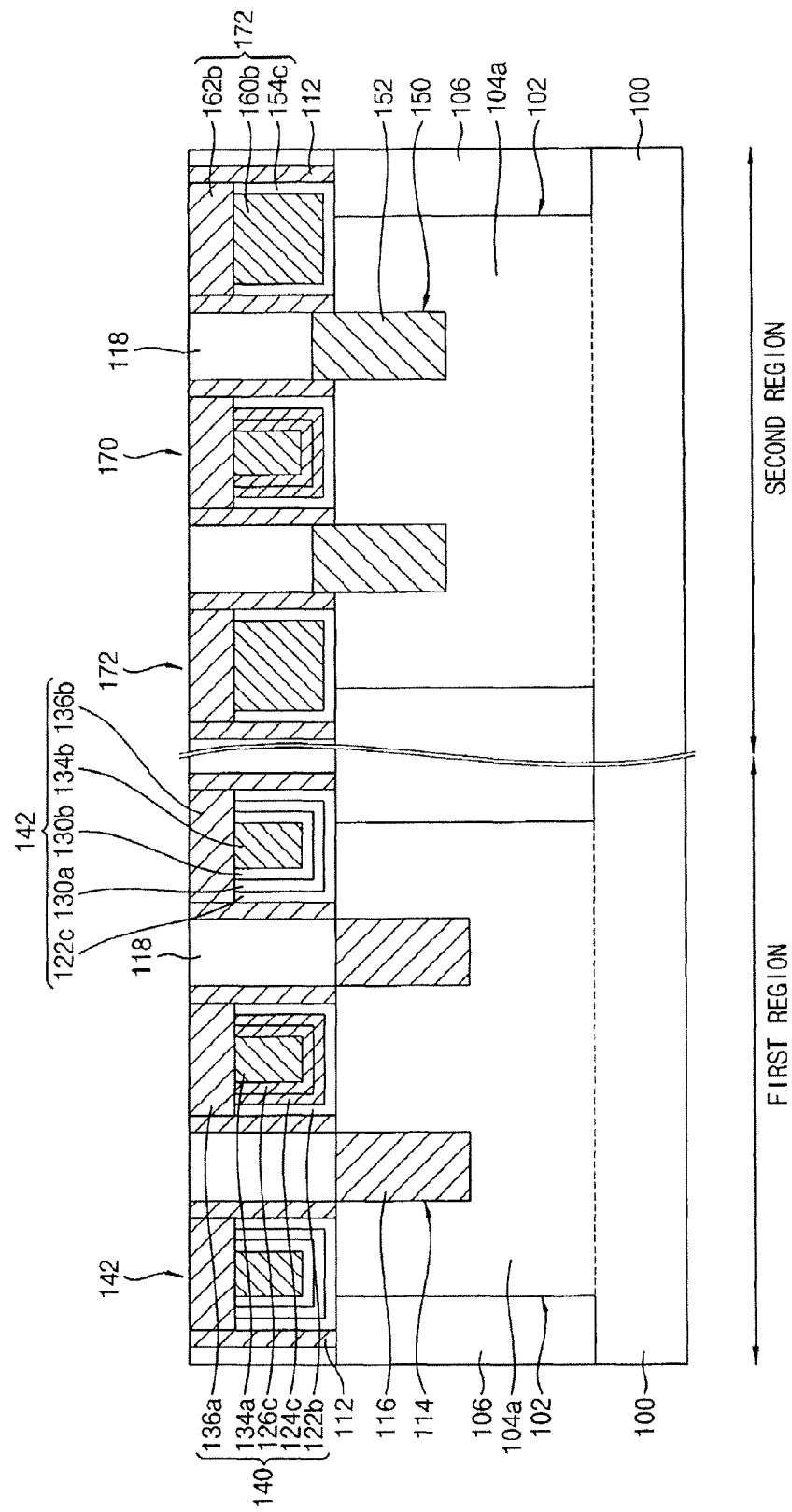
FIG. 28 is a cross-sectional view illustrating a semiconductor device in accordance with an example embodiment of the present invention.

FIG. 28 is a cross-sectional view illustrating a semiconductor device in accordance with an example embodiment of the present invention.

Referring to FIG. 28, a first transistor may be formed on a first region of a substrate 100, and the first transistor may include a first gate structure 140, a first dummy gate structure 142, and first source/drain regions 116. The first transistor may be a p-type FinFET.

The first gate structure 140 may include a first gate insulation pattern 122b, a first threshold voltage control pattern 124c, a first barrier pattern 126c, a first gate electrode 134a and a first hard mask 136a. The first dummy gate structure 142 may be spaced apart from the first gate structure 140. The first dummy gate structure 142 may include a first stressor pattern 130a including titanium oxide. The first source/drain regions 116 may be doped with p-type impurities.

The first transistor may be substantially the same as or similar to the p-type FinFET illustrated with reference to FIGS. 1 to 4.

A second transistor may be formed on a second region of the substrate 100, and the second transistor may include a second gate structure 170, a second dummy gate structure 172, and second source/drain regions 152. The second transistor may be an n-type FinFET.

The second gate structure 170 may include a second gate insulation pattern 154b, a second threshold voltage control pattern 156c, a second barrier pattern 158c, a second gate electrode 160a and a second hard mask 162a. The second dummy gate structure 172 may be spaced apart from the second gate structure 170. The second dummy gate structure 172 may have a structure different from a structure of the gate structure 170. The second gate structure 172 may not include titanium or titanium oxide. The second source/drain regions 152 may be doped with n-type impurities.

The second transistor may be substantially the same as or similar to the n-type FinFET illustrated with reference to FIG. 20. Thus, the semiconductor device may have the p-type FinFET and the n-type FinFET having good electrical characteristics.

As described above, the semiconductor device may be applied to memory devices and logic devices including the transistors.

The foregoing is illustrative of example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments of the present invention and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a gate structure on a substrate, the gate structure including
      a first gate insulation pattern, a conductive pattern for controlling a threshold voltage, a first gate electrode and a first mask sequentially stacked;
   a dummy gate structure spaced apart from the gate structure, the dummy gate structure including a first stressor pattern including titanium oxide; and
   source/drain regions adjacent to the gate structure, the source/drain regions doped with p-type impurities.

2. The semiconductor device of claim 1, wherein the dummy gate structure has a stacked structure different from a stacked structure of the gate structure.

3. The semiconductor device of claim 1, wherein the dummy gate structure includes a second gate insulation pattern, the first stressor pattern, a second gate electrode and a second mask sequentially stacked.

4. The semiconductor device of claim 1, wherein the conductive pattern of the gate structure includes titanium.

5. The semiconductor device of claim 1, wherein the first stressor pattern of the dummy gate structure includes an oxide of a material included in the conductive pattern.

6. The semiconductor device of claim 1, further comprising a barrier pattern including titanium on the conductive pattern of the gate structure.

7. The semiconductor device of claim 6, further comprising a second stressor pattern on the first stressor pattern of the dummy gate structure, wherein the second stressor pattern includes an oxide of a material included in the barrier pattern.

8. The semiconductor device of claim 1, wherein a width of the dummy gate structure is substantially equal to or greater than a width of the gate structure.

9. The semiconductor device of claim 1, further comprising a plurality of dummy gate structures adjacent to each of opposite sidewalls of the gate structure.

10. The semiconductor device of claim 1, further comprising an active fin protruding from a surface of the substrate, wherein each of the gate structure and the dummy gate structure is formed on sidewalls and a top surface of the active fin, and extends in a direction crossing the active fin.

11. The semiconductor device of claim 1, further comprising an additional dummy gate structure between the gate structure and the dummy gate structure, wherein the additional dummy gate structure has a stacked structure substantially the same as a stacked structure of the gate structure.

12. A semiconductor device, comprising:
A first transistor including:
  a first gate structure on a substrate, the first gate structure including a first gate insulation pattern, a first conductive pattern for controlling a threshold voltage, a first gate electrode and a first mask sequentially stacked;
  a first dummy gate structure spaced apart from the first gate structure, the first dummy gate structure including a first stressor pattern including titanium oxide; and
  first source/drain regions adjacent to the first gate structure, the first source/drain regions doped with p-type impurities; and
a second transistor including;
  a second gate structure on the substrate, the second gate structure including a second gate insulation pattern, a second conductive pattern for controlling a threshold voltage, a second gate electrode and a second mask sequentially stacked;
  a second dummy gate structure spaced apart from the second gate structure, the second dummy gate structure not including titanium and titanium oxide; and
  second source/drain regions adjacent to the second gate structure, the second source/drain regions doped with n-type impurities.

13. The semiconductor device of claim 12, wherein the second dummy gate structure includes the second gate insulation pattern, the second gate electrode and the second mask sequentially stacked.

14. The semiconductor device of claim 12, wherein the first conductive pattern has a work function more than about 4.5 eV, and the second conductive pattern has a work function less than about 4.5 eV.

15. The semiconductor device of claim 12, wherein the first and the second conductive patterns include titanium.

16. The semiconductor device of claim 12, wherein a width of the first dummy gate structure is substantially equal to or greater than a width of the first gate structure.

17. The semiconductor device of claim 12, further comprising a first active fin protruding from a surface of the substrate, wherein each of the first gate structure and the first dummy gate structure is formed on sidewalls and a top surface of the first active fin, and extends in a direction crossing the first active fin.

18. The semiconductor device of claim 12, further comprising a second active fin protruding from a surface of the substrate, wherein each of the second gate structure and the second dummy gate structure is formed on sidewalls and a top surface of the second active fin, and extends in a direction crossing the second active fin.

19. The semiconductor device of claim 12, further comprising an additional first dummy gate structure between the first gate structure and the first dummy gate structure, wherein the additional first dummy gate structure has a stacked structure substantially the same as a stacked structure of the first gate structure.

20. A semiconductor device, comprising:
  a gate structure on a substrate, the gate structure including a first gate insulation pattern, a conductive pattern for controlling a threshold voltage, a first gate electrode and a first mask sequentially stacked, the conductive pattern including titanium;
  a dummy gate structure spaced apart from the gate structure, the dummy gate structure not including titanium and titanium oxide; and
  source/drain regions adjacent to the gate structure, the source/drain regions doped with n-type impurities,
  wherein the dummy gate structure has a stacked structure different from a stacked structure of the gate structure.

* * * * *